United States Patent
Ko et al.

(10) Patent No.: US 9,299,693 B2
(45) Date of Patent: Mar. 29, 2016

(54) ELECTROSTATIC DISCHARGE PROTECTION DEVICE

(71) Applicant: Samsung Electronics Co., Ltd., Suwon-si (KR)

(72) Inventors: Jaehyok Ko, Hwaseong-si (KR); Hangu Kim, Seongnam-si (KR); Minchang Ko, Hwaseong-si (KR); Kyoungki Jeon, Hwaseong-si (KR)

(73) Assignee: SAMSUNG ELECTRONICS CO., Ltd. (KR)

( * ) Notice: Subject to any disclaimer, the term of this patent is extended or adjusted under 35 U.S.C. 154(b) by 66 days.

(21) Appl. No.: 14/094,039

(22) Filed: Dec. 2, 2013

(65) Prior Publication Data
US 2014/0151743 A1    Jun. 5, 2014

(30) Foreign Application Priority Data
Dec. 4, 2012    (KR) .......................... 10-2012-0139780

(51) Int. Cl.
*H01L 29/739*    (2006.01)
*H01L 27/02*    (2006.01)

(52) U.S. Cl.
CPC .................................... *H01L 27/027* (2013.01)

(58) Field of Classification Search
CPC .............. H01L 27/027; H01L 29/7395; H01L 27/0262; H01L 29/66393; H01L 29/7436
USPC .......................................................... 257/139
See application file for complete search history.

(56) References Cited

U.S. PATENT DOCUMENTS

| | | | |
|---|---|---|---|
| 7,202,114 B2 | 4/2007 | Salcedo et al. | |
| 7,394,133 B1 | 7/2008 | Vashchenko et al. | |
| 7,601,991 B2 | 10/2009 | Salcedo et al. | |
| 7,719,026 B2 | 5/2010 | Lou et al. | |
| 7,773,356 B2 | 8/2010 | Ryu et al. | |
| 7,777,999 B2 | 8/2010 | Kang et al. | |
| 7,842,971 B2 | 11/2010 | Liu et al. | |
| 2003/0042498 A1* | 3/2003 | Ker et al. ....................... | 257/173 |
| 2007/0069310 A1 | 3/2007 | Song et al. | |
| 2011/0204415 A1 | 8/2011 | Wijmeersch et al. | |
| 2011/0227127 A1 | 9/2011 | Ohta et al. | |
| 2011/0241069 A1* | 10/2011 | Vashchenko ................... | 257/140 |
| 2011/0310514 A1* | 12/2011 | Huang et al. .................... | 361/56 |
| 2012/0257317 A1* | 10/2012 | Abou-Khalil et al. .......... | 361/56 |
| 2013/0092977 A1* | 4/2013 | Huesken et al. ............... | 257/139 |

FOREIGN PATENT DOCUMENTS

| | | |
|---|---|---|
| JP | 2000133775 | 5/2000 |
| KR | 100790445 | 12/2007 |
| KR | 1020090098237 | 9/2009 |
| KR | 1020090104311 | 10/2009 |
| KR | 1020100089519 | 8/2010 |

* cited by examiner

*Primary Examiner* — Walter H Swanson
(74) *Attorney, Agent, or Firm* — Onello & Mello LLP

(57) ABSTRACT

An electrostatic discharge protection device may include a first conductivity type well, a second conductivity well; a first doping region and a second doping region which are formed in the first conductivity type well and have different conductivity types from each other; a third doping region and a fourth doping region which are formed in the second conductivity type well and have different conductivity types from each other; and a fifth doping region formed in the second conductivity type well between the first and second doping regions and the third and fourth doping regions.

15 Claims, 33 Drawing Sheets

ELECTROSTATIC DISCHARGE PROTECTION DEVICE

CROSS-REFERENCE TO RELATED APPLICATIONS

This U.S. non-provisional patent application claims priority under 35 U.S.C. §119 of Korean Patent Application No. 10-2012-0139780, filed on Dec. 4, 2012, the entire contents of which are hereby incorporated by reference.

BACKGROUND

Inventive concepts relate to semiconductor devices, and more particularly, to electrostatic discharge protection devices and methods.

As a semiconductor manufacturing technology develops, integration of a semiconductor circuit is proceeding. Integration of a semiconductor circuit can reduce a manufacturing cost of a semiconductor circuit and can make mass production possible and thereby it is continuously being studied.

As integration of a semiconductor circuit proceeds, the size of constituent elements is reduced. Reduction of a size of constituent elements may increase the circuit's susceptibility to electrostatic discharge.

To protect a semiconductor circuit from an electrostatic discharge, an electrostatic discharge protection device may be employed in a semiconductor circuit. An electrostatic discharge protection device having higher reliability and better electrostatic discharge protection characteristics would be advantageous.

SUMMARY

Exemplary embodiments in accordance with principles of inventive concepts include an electrostatic discharge protection device including a doping region that disturbs charge flow due to an electrostatic discharge, thereby providing a high holding voltage.

Exemplary embodiments in accordance with principles of inventive concepts may include an electrostatic discharge protection device comprising: a first conductivity type well; a second conductivity type well in contact with the first conductivity type well; first and second doping regions formed in the first conductivity type well, connected to a first electrode in common and having different conductivity types from each other; third and fourth doping regions formed in the second conductivity type well, connected to a second electrode in common and having different conductivity types from each other; and a fifth doping region formed in the second conductivity type well between the first and second doping regions and the third and fourth doping regions Exemplary embodiments in accordance with principles of inventive concepts may include an electrostatic discharge protection device wherein the first conductivity type well is a P conductivity type well.

Exemplary embodiments in accordance with principles of inventive concepts may include an electrostatic discharge protection device wherein the second conductivity type well is an N conductivity type well.

Exemplary embodiments in accordance with principles of inventive concepts may include an electrostatic discharge protection device wherein the second doping region is between the first doping region and the fifth doping region, and wherein the first doping region is a P conductivity type and the second doping region is an N conductivity type.

Exemplary embodiments in accordance with principles of inventive concepts may include an electrostatic discharge protection device wherein the second doping region includes a plurality of doping regions spaced apart from one another and the plurality of doping regions spaced apart from one another are connected to the first electrode in common.

Exemplary embodiments in accordance with principles of inventive concepts may include an electrostatic discharge protection device wherein the third doping region is between the fourth doping region and the fifth doping region, and wherein the third doping region is a P conductivity type and the fourth doping region is an N conductivity type.

Exemplary embodiments in accordance with principles of inventive concepts may include an electrostatic discharge protection device wherein the third doping region includes a plurality of doping regions spaced apart from one another and the plurality of doping regions spaced apart from one another are connected to the second electrode in common.

Exemplary embodiments in accordance with principles of inventive concepts may include an electrostatic discharge protection device wherein the fifth doping region is an N conductivity type.

Exemplary embodiments in accordance with principles of inventive concepts may include an electrostatic discharge protection device wherein the second conductivity type well is formed in the first conductivity type well.

Exemplary embodiments in accordance with principles of inventive concepts may include an electrostatic discharge protection device wherein the fifth doping region is spaced apart from the third and fourth doping regions.

Exemplary embodiments in accordance with principles of inventive concepts may include an electrostatic discharge protection device further comprising a device isolation layer formed at an interface between the first conductivity type well and the second conductivity type well.

Exemplary embodiments in accordance with principles of inventive concepts may include an electrostatic discharge protection device further comprising a device isolation layer between the fifth doping region and the third doping region and between the fifth doping region and the fourth doping regions.

Exemplary embodiments in accordance with principles of inventive concepts may include an electrostatic discharge protection device further comprising a gate electrode electrically isolated from the first conductivity type well on the first conductivity type well adjacent to an interface between the first and second conductivity type wells.

Exemplary embodiments in accordance with principles of inventive concepts may include an electrostatic discharge protection device comprising: a semiconductor device including a first electrode, a second electrode and a gate electrode; a capacitor connected between the second electrode and the gate electrode; and a resistor connected between the gate electrode and the first electrode, wherein the semiconductor device comprises: a first conductivity type well; a second conductivity type well in contact with the first conductivity type well; first and second doping regions formed in the first conductivity type well, connected in common to form the first electrode and having different conductivity types from each other; third and fourth doping regions formed in the second conductivity type well, connected in common to form the second electrode and having different conductivity types from each other; a fifth doping region in the second conductivity type well between the first and second doping regions and the third and fourth doping regions; and a conductive material electrically isolated from the first conductivity type well on the first conductivity type well adjacent to an interface between the first and second conductivity type wells to form the gate electrode.

Exemplary embodiments in accordance with principles of inventive concepts may include an electrostatic discharge protection device wherein the second electrode is connected to a pad for protecting an electrostatic discharge and the first electrode is connected to a pad for leaking the electrostatic discharge.

Exemplary embodiments in accordance with principles of inventive concepts may include an electrostatic discharge circuit, comprising: a lateral bipolar junction transistor; a vertical bipolar junction transistor; and a doping region to disrupt current flow and to thereby increase the holding voltage of the electrostatic discharge circuit.

Exemplary embodiments in accordance with principles of inventive concepts may include a semiconductor device including: a semiconductor device including a first electrode, a second electrode and a gate electrode; a capacitor connected between the second electrode and the gate electrode; and a resistor connected between the gate electrode and the first electrode, an electrostatic discharge circuit of connected between the first and second electrodes.

Exemplary embodiments in accordance with principles of inventive concepts may include an electronic system including: a display driver; a display panel; and semiconductor device connected to suppress electrostatic discharge in the display driver.

Exemplary embodiments in accordance with principles of inventive concepts may include an electronic system including: a processor; a display; storage; memory; and an electronic system including a semiconductor device including a first electrode, a second electrode and a gate electrode; a capacitor connected between the second electrode and the gate electrode; and a resistor connected between the gate electrode and the first electrode, an electrostatic discharge circuit of connected between the first and second electrodes.

Exemplary embodiments in accordance with principles of inventive concepts may include a cellular telephone including a processor; a display; storage; memory; and an electronic system including a semiconductor device including a first electrode, a second electrode and a gate electrode; a capacitor connected between the second electrode and the gate electrode; and a resistor connected between the gate electrode and the first electrode, an electrostatic discharge circuit of connected between the first and second electrodes.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION

Figure 1:
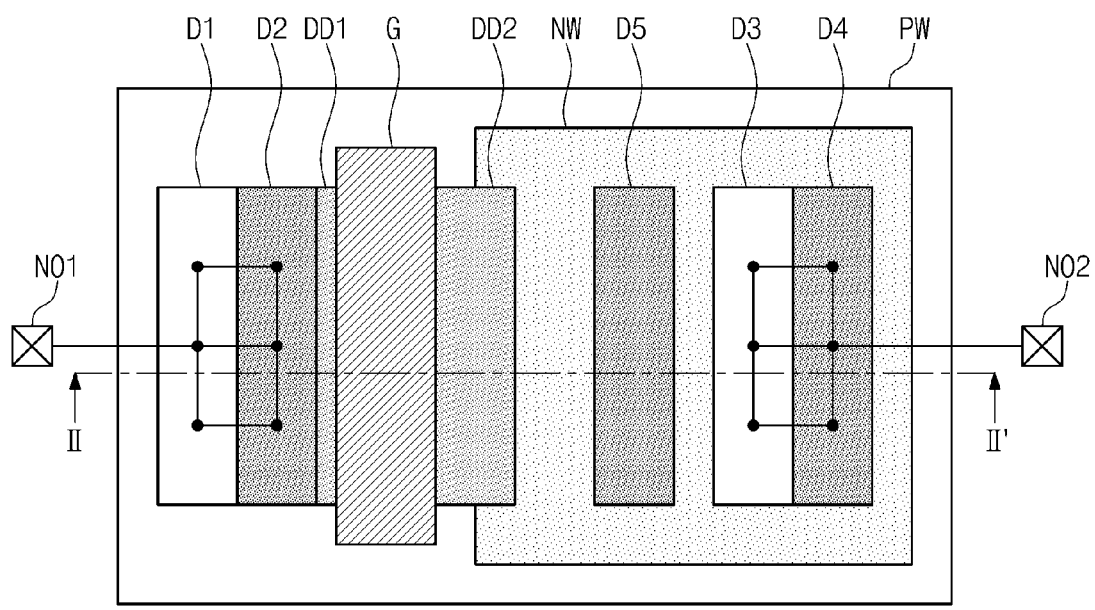
FIG. 1 is a top plan view illustrating an electrostatic discharge protection circuit in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
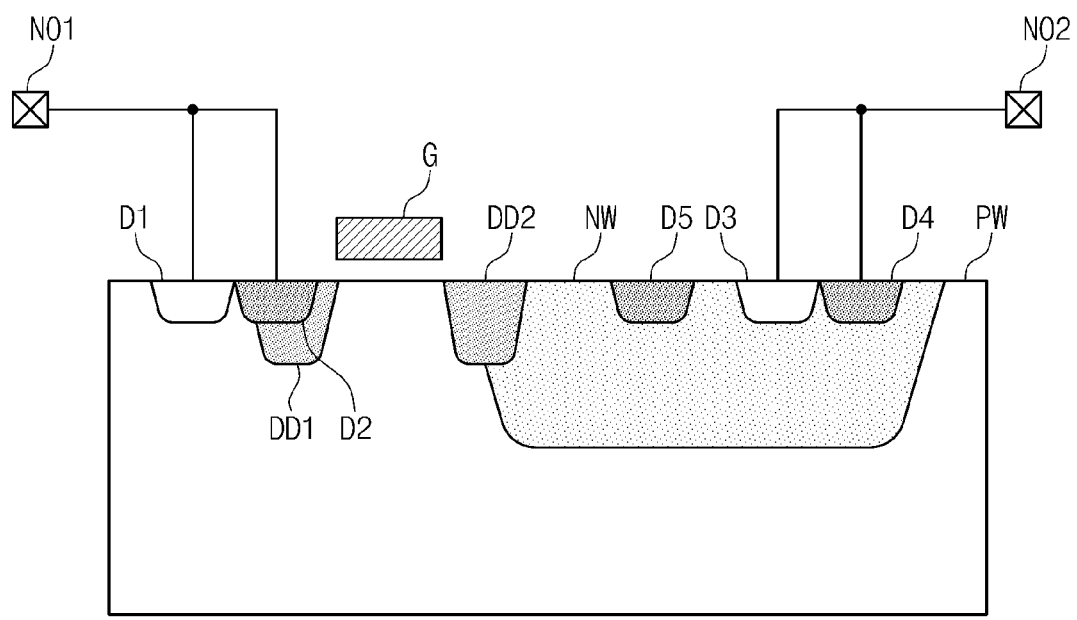
FIG. 2 is a cross sectional view taken along the line II-II' of FIG. 1.

Hereinafter, exemplary embodiments in accordance with principles of inventive concepts will be explained in detail with reference to the accompanying drawings. FIG. 1 is a top plan view illustrating an exemplary embodiment of an electrostatic discharge protection circuit 100a in accordance with principles of inventive concepts. FIG. 2 is a cross sectional view taken along the line II-II' of FIG. 1. Referring to FIGS. 1 and 2, a first conductivity type well PW and a second conductivity type well NW are provided.

The first conductivity type well PW may be a P conductivity type well and may be a P conductivity type substrate, a P conductivity type well or a P conductivity type pocket.

The second conductivity type well NW may be an N conductivity type well and may be in contact with the first conductivity type well PW. The second conductivity type well NW may be a well formed in the first conductivity type well PW.

In exemplary embodiments in accordance with principles of inventive concepts, a first doping region D1 and a second doping region D2 may be formed in the first conductivity type well PW. The first doping region D1 may have a P conductivity type. The doping concentration of the first doping region D1 may be higher than the doping concentration of the first conductivity type well PW, for example. The second doping region D2 may have an N conductivity type. The doping concentration of the second doping region D2 may be higher than the doping concentration of the second conductivity type well NW. A deep doping region DD1 may be provided under the second doping region D2. The deep doping region DD1 may have the same N conductivity type as the second doping region D2. The doping concentration of the deep doping region DD1 may be higher than the doping concentration of the second conductivity type well NW and may be lower than the doping concentration of the second doping region D2.

In exemplary embodiments in accordance with principles of inventive concepts, a third doping region D3 and a fourth doping region D4 are formed in the second conductivity type well NW. The third doping region D3 may have a P conductivity type. The doping concentration of the third doping region D3 may be higher than the doping concentration of the first conductivity type well PW. The fourth doping region D3 may have an N type conductivity type. The doping concentration of the fourth doping region D4 may be higher than the doping concentration of the second conductivity type well NW.

In exemplary embodiments in accordance with principles of inventive concepts, a fifth doping region D5 is provided in the second conductivity type well NW between the first and second doping regions D1 and D2 and the third and fourth doping regions D3 and D4. The fifth doping region D5 may have an N conductivity type. The doping concentration of the fifth doping region D5 may be higher than the doping concentration of the second conductivity type well NW.

The second doping region D2 may be disposed between the first doping region D1 and the fifth doping region D5. The first and second doping regions D1 and D2 may be in contact with each other. The third doping region D3 may be disposed between the fourth doping region D4 and the fifth doping region D5. The third and fourth doping regions D3 and D4 may be in contact with each other. The fifth doping region D5 may be spaced apart from the third and fourth doping regions D3 and D4.

A gate electrode G may be provided on the first conductivity type well PW adjacent to an interface between the first conductivity type well PW and the second conductivity type well NW. The gate electrode G may be electrically separated from the first conductivity type well PW.

In exemplary embodiments in accordance with principles of inventive concepts, a deep doping region DD2 may be provided between the gate electrode G and the second conductivity type well NW. The doping concentration of the deep doping region DD2 may be higher than the doping concentration of the second conductivity type well NW and may be lower than doping concentrations of the second, fourth and fifth doping regions D2, D4 and D5, for example.

The second, fourth and fifth doping regions D2, D4 and D5 may have an N conductivity type of high doping concentration. The deep doping regions DD1 and DD2 may have an N conductivity type of medium doping concentration. The second conductivity type well NW may have an N conductivity type of low doping concentration. The first and third doping regions D1 and D3 may have a P conductivity type of high doping concentration. The first conductivity type well PW may have a P conductivity type of low doping concentration. The first and second doping regions D1 and D2 may be connected in common to form a first electrode N01. The first and second doping regions D1 and D2 may be connected in common through a contact (conductive path) to form a first electrode N01. The third and fourth doping regions D3 and D4 may be connected in common to form a second electrode N02. The third and fourth doping regions D3 and D4 may be connected in common through a contact (conductive path) to form a second electrode N02.

In exemplary embodiments in accordance with principles of inventive concepts, the first electrode N01 and the second electrode N02 may be connected to a circuit for protecting an electrostatic discharge. The first electrode N01 and the second electrode N02 may be connected between pads of a semiconductor die, for example. The second electrode N02 may be connected to a pad for protection from electrostatic discharge, for example, for the signal pad. The first electrode N01 may be connected to a pad, such as a ground pad or a power supply pad, to leak, or "bleed off," electrostatic discharge. That is the electrostatic discharge protection device 100a can leak an electrostatic discharge occurring in the second electrode N02 into the first electrode N01 (and from first electrode N01, back to a supply source).

Figure 3:
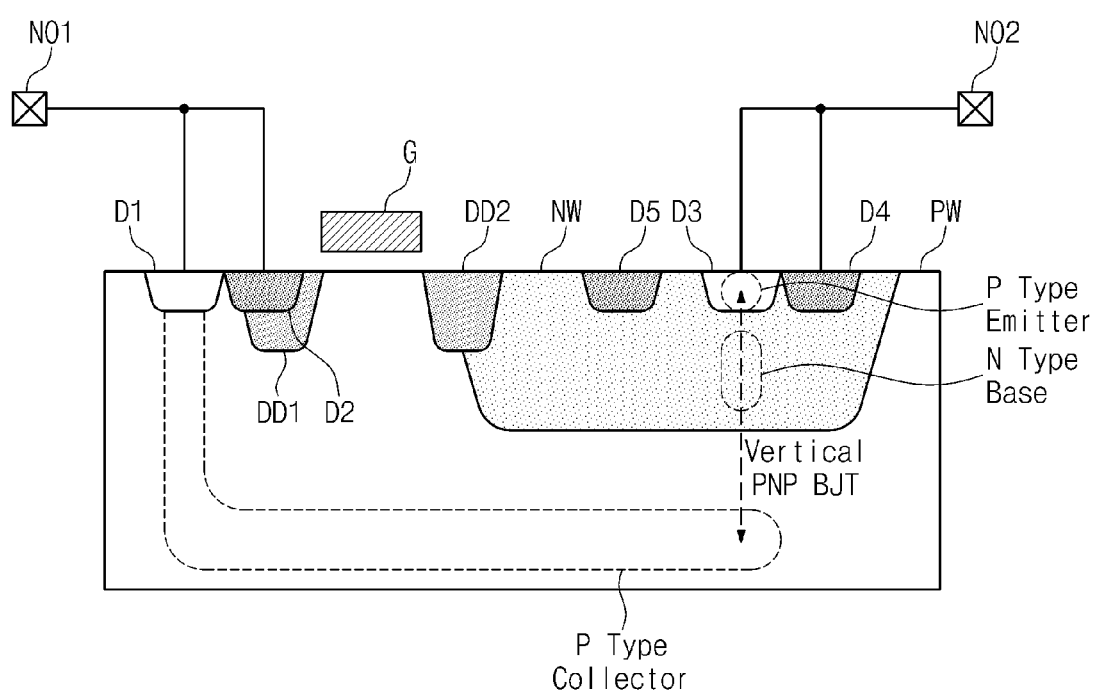
FIGS. 3 and 4 are drawings for explaining an operation method of the electrostatic discharge protection circuit in accordance with principles of inventive concepts.
Figure 4:
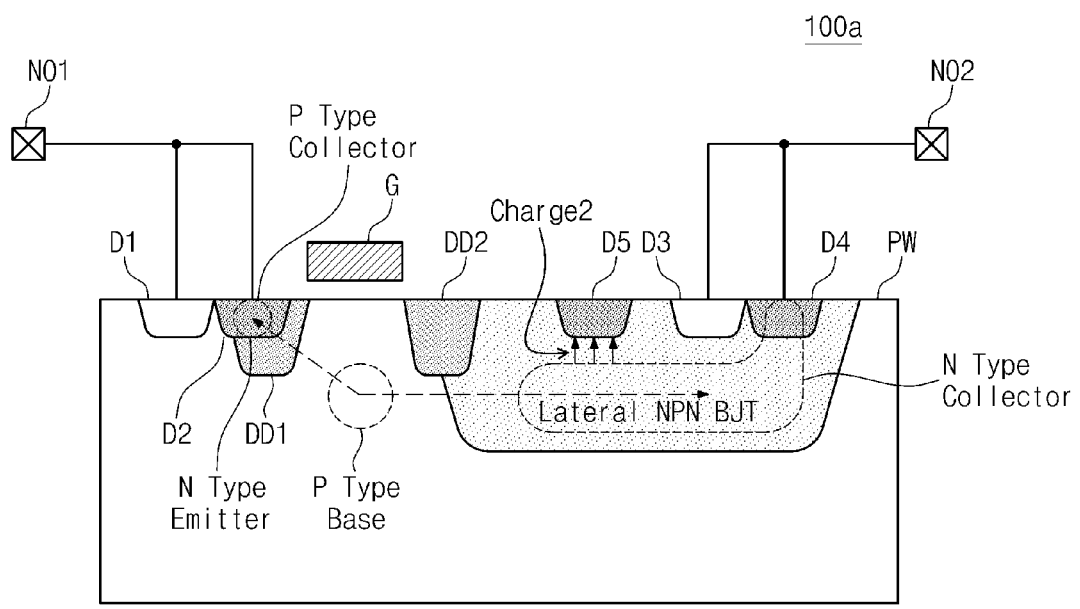

FIGS. 3 and 4 are drawings for explaining an operational method of the electrostatic discharge protection circuit in accordance with an exemplary embodiment in accordance with principles of inventive concepts, such as that described in the discussion related to FIGS. 1 and 2. Referring to FIG. 3, if an electrostatic discharge occurs on the second electrode N02, a high voltage and a strong current may be applied to the second electrode N02. The third doping region D3 and the second conductivity type well NW are forward biased. As a result, a voltage and a current applied to the second electrode N02 are transmitted to the second conductivity type well NW through the third doping region D3.

The second conductivity type well NW and the first conductivity type well PW are in a reverse bias state. If a voltage and a current applied to the second conductivity type well NW exceed the reverse bias breakdown voltage, the voltage and current applied to the second conductivity type well NW are transmitted to the first conductivity type well PW. When the voltage applied to the second conductivity type well NW is transferred to the first conductivity type well, the third doping region D3 operates as a P conductivity type emitter, the second conductivity type well NW operates as an N conductivity type base and the first conductivity type well PW and the first doping region D1 operate as a P conductivity type collector. That is, vertical PNP BJT is formed between the second electrode N02 and the first electrode N01 and thereby an electrostatic discharge occurring in the second electrode N02 leaks into the first electrode N01.

Referring to FIG. 4, if a voltage and a current being applied to the second conductivity type well NW exceed the reverse bias breakdown voltage between the second conductivity type well NW and the first conductivity type well PW, the voltage and the current applied to the second conductivity type well NW are transmitted to the first conductivity type well PW.

The first conductivity type well PW, the second doping region D2 and the deep doping region DD1 are forward biased. As a result, the voltage and current applied to the first conductivity type well PW is transmitted to the second doping region D2. With the voltage transmitted to the second doping region D2, the fourth doping region D4 and the second conductivity type well NW operate as an N conductivity type collector, the first conductivity type well PW operates as a P conductivity type base and the second doping region D2 and the deep doping region DD1 operate as an N conductivity type emitter. A lateral NPN BJT is formed between the second electrode N02 and the first electrode N01 and, thereby, an electrostatic discharge occurring in the second electrode N02 leaks into the first electrode N01.

In accordance with principles of inventive concepts, the fifth doping region D5 affects the lateral NPN BJT. When the lateral NPN BJT operates, charges which flowed in the fourth doping region D4 from the second electrode N02 are transmitted to the first conductivity type well PW through the second conductivity type well NW. The fifth doping region D5 is located at a path through which charges are transmitted. Thus, a part of the charge which flowed in the second conductivity type well NW is not transmitted to the first conductivity type well PW but, instead, flows in the fifth doping region D5.

When an electrostatic discharge leaks from the second electrode N02 to the first electrode N01, the fifth doping region D5 serves to disturb the flow of charge. In this manner, when an electrostatic discharge leaks, the voltage of the second electrode N02 increases. That is, the holding voltage of the second electrode N02 increases. The holding voltage may be a voltage generated from an electrode of an electrostatic discharge protection device when an electrostatic discharge leaks.

A conventional electrostatic discharge protection device has a very low holding voltage, one that is much lower than a conventional operational voltage of an electronic or semiconductor device. In a conventional semiconductor device, when an electrostatic discharge protection device leaks (that is, "bleeds off," or re-routes) an electrostatic discharge, a holding voltage much lower than a conventional operational voltage is transmitted to the protected semiconductor device and, as a result, the semiconductor device cannot perform a normal operation, because the protected node is pulled down to the much lower holding voltage.

In exemplary embodiments in accordance with principles of inventive concepts, the fifth doping region D5 disturbs a flow of current, thereby providing a holding voltage having a similar value to the operational voltage. In this manner, in accordance with principles of inventive concepts, even when an electrostatic discharge protection operation is performed, a protected semiconductor device can operate normally.

Figure 5:
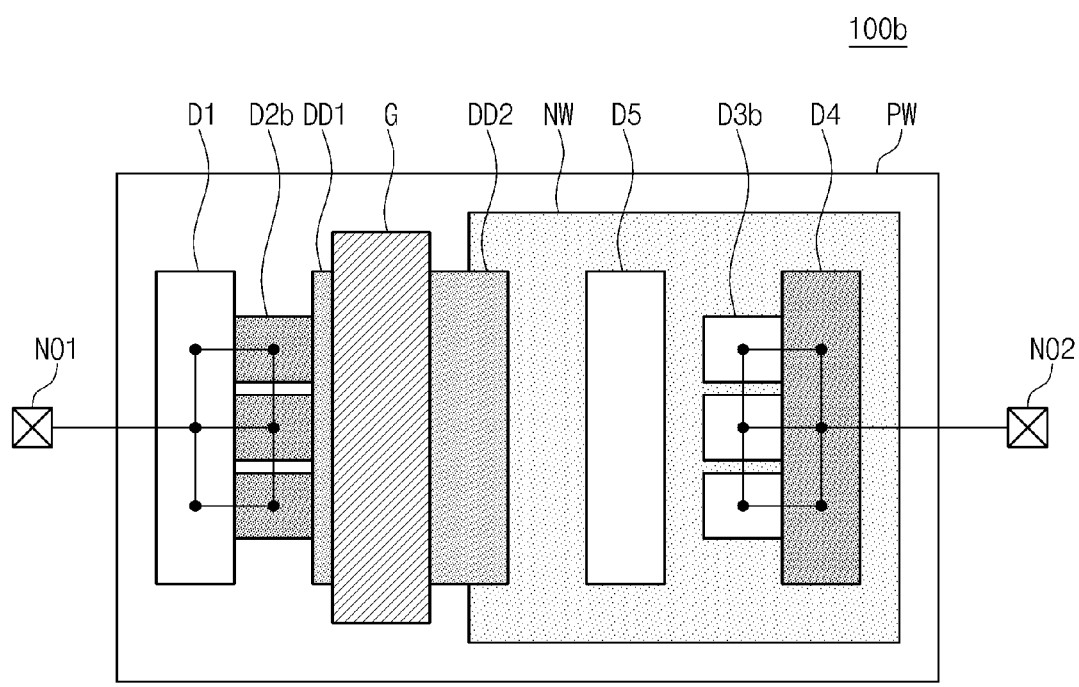
FIG. 5 is a top plan view illustrating an electrostatic discharge protection circuit in accordance with principles of inventive concepts.

FIG. 5 is a top plan view illustrating a second exemplary embodiment of an electrostatic discharge protection circuit 100b in accordance with principles of inventive concepts. A cross sectional view of the electrostatic discharge protection circuit 100b of FIG. 5 may be the same as FIG. 2. Thus, for clarity and brevity, the cross sectional view of the electrostatic discharge protection circuit 100b will not be repeated here.

Comparing the electrostatic discharge protection circuit 100b with the electrostatic discharge protection circuit 100a illustrated in FIGS. 1 and 2, each of a second doping region D2b and a third doping region D3b of the electrostatic discharge protection circuit 100b is formed to have an island form. The second doping region D2b includes a plurality of doping regions spaced apart from each other. The third doping region D3b includes a plurality of doping regions spaced apart from each other.

Comparing the electrostatic discharge protection circuit 100b with the electrostatic discharge protection circuit 100a, areas of the second doping region D2b and the third doping region D3b are reduced. The second doping region D2b acts as an emitter of a lateral NPN BJT. The third doping region D3b acts as an emitter of a vertical PNP BJT. If the second doping region D2b and the third doping region D3b are formed to have an island form, areas of the lateral NPN GJT and the vertical PNP BJT are reduced. In this manner, flow of current through the electrostatic discharge protection device 100b is disturbed, or impeded, and as a result, the holding voltage may increase further.

Figure 6:
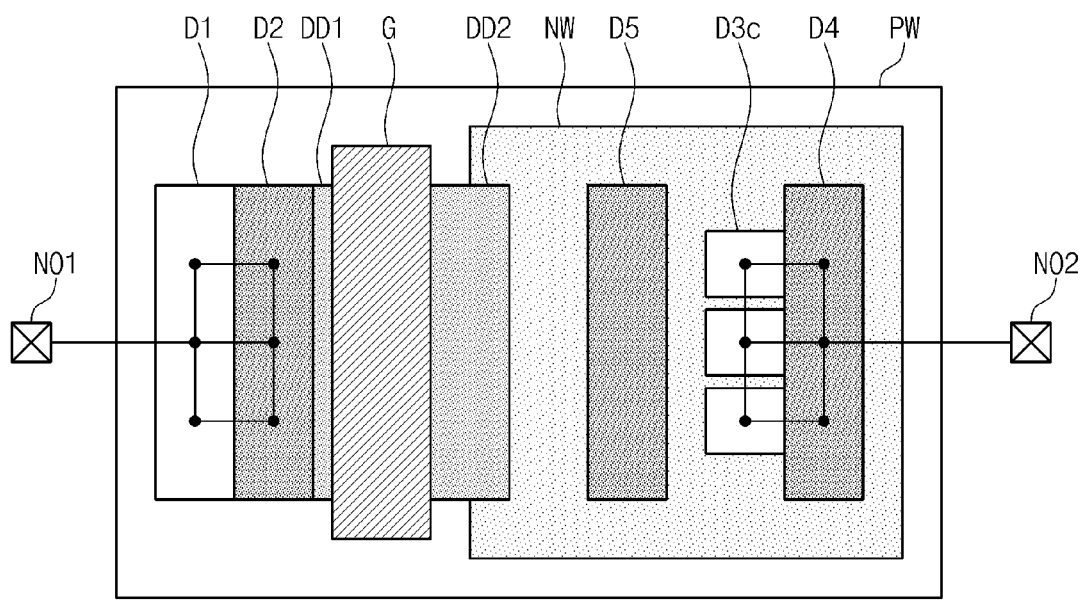
FIG. 6 is a top plan view illustrating an electrostatic discharge protection circuit in accordance with principles of inventive concepts.

FIG. 6 is a top plan view illustrating a third exemplary embodiment of an electrostatic discharge protection circuit 100c in accordance with principles of inventive concepts. A cross sectional view of the electrostatic discharge protection circuit 100c of FIG. 6 may be the same as that of FIG. 2. For brevity and clarity of description, the cross sectional view of the electrostatic discharge protection circuit 100c will not be repeated here.

Comparing the electrostatic discharge protection circuit 100c with the electrostatic discharge protection circuit 100a illustrated in FIGS. 1 and 2, a third doping region D3c of the electrostatic discharge protection circuit 100c is formed to have an island form. The third doping region D3c includes a plurality of doping regions spaced apart from each other.

Figure 7:
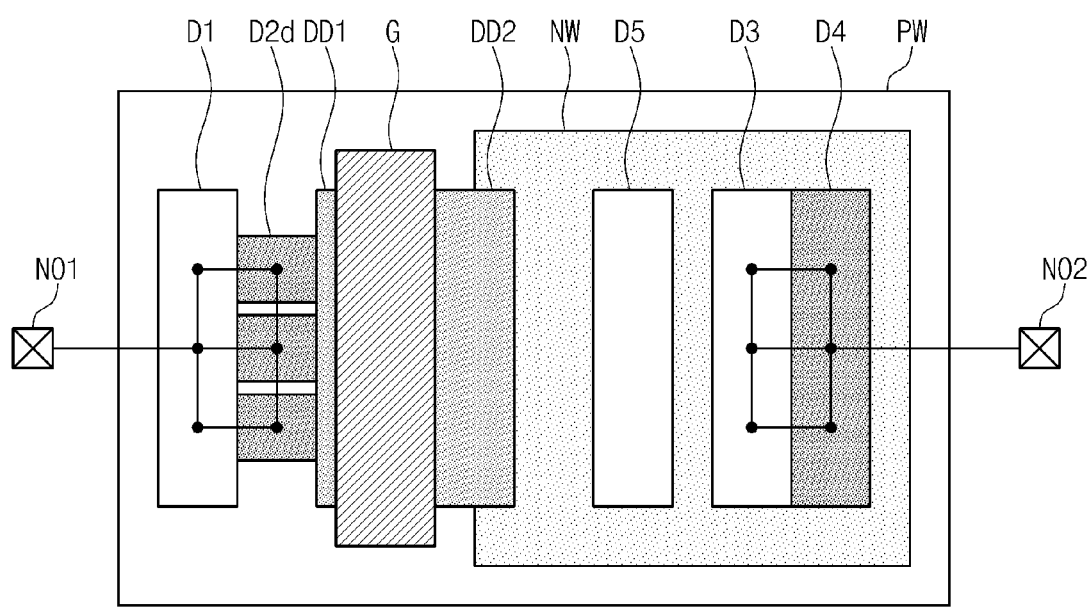
FIG. 7 is a top plan view illustrating an electrostatic discharge protection circuit in accordance with principles of inventive concepts.

FIG. 7 is a top plan view illustrating a fourth exemplary embodiment of an electrostatic discharge protection circuit 100d in accordance with principles of inventive concepts. A cross sectional view of the electrostatic discharge protection circuit 100d of FIG. 7 may be the same as FIG. 2. For the sake of brevity and clarity, the cross sectional view of the electrostatic discharge protection circuit 100d will not be repeated here.

Comparing the electrostatic discharge protection circuit 100d with the electrostatic discharge protection circuit 100a illustrated in FIGS. 1 and 2, a second doping region D2d of the electrostatic discharge protection circuit 100d is formed to have an island form. The second doping region D2d includes a plurality of doping regions spaced apart from each other.

Figure 8:
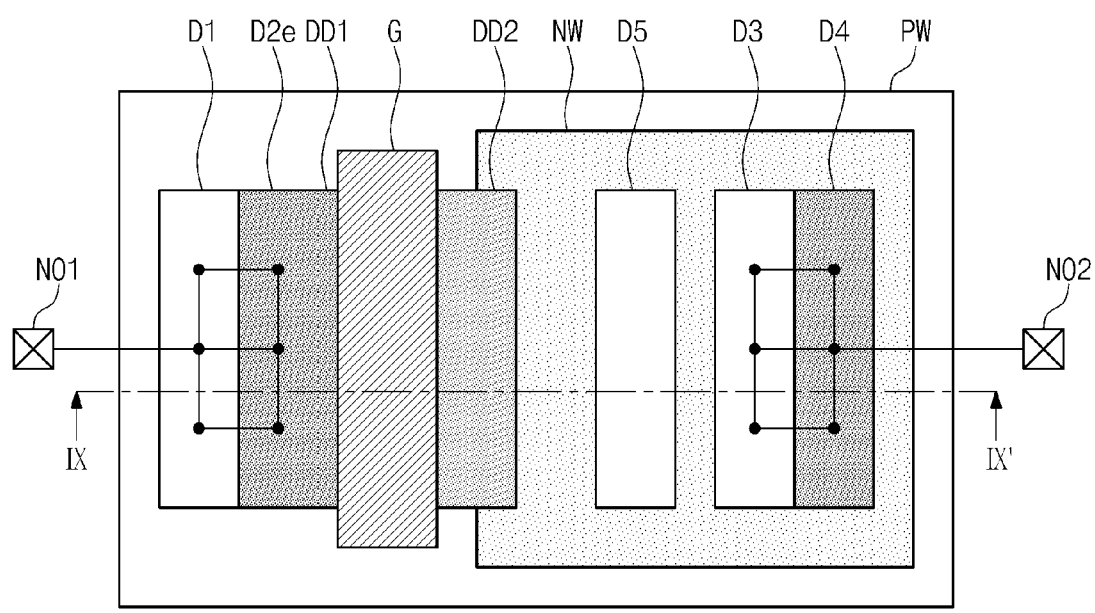
FIG. 8 is a top plan view illustrating an electrostatic discharge protection circuit in accordance with principles of inventive concepts.
Figure 9:
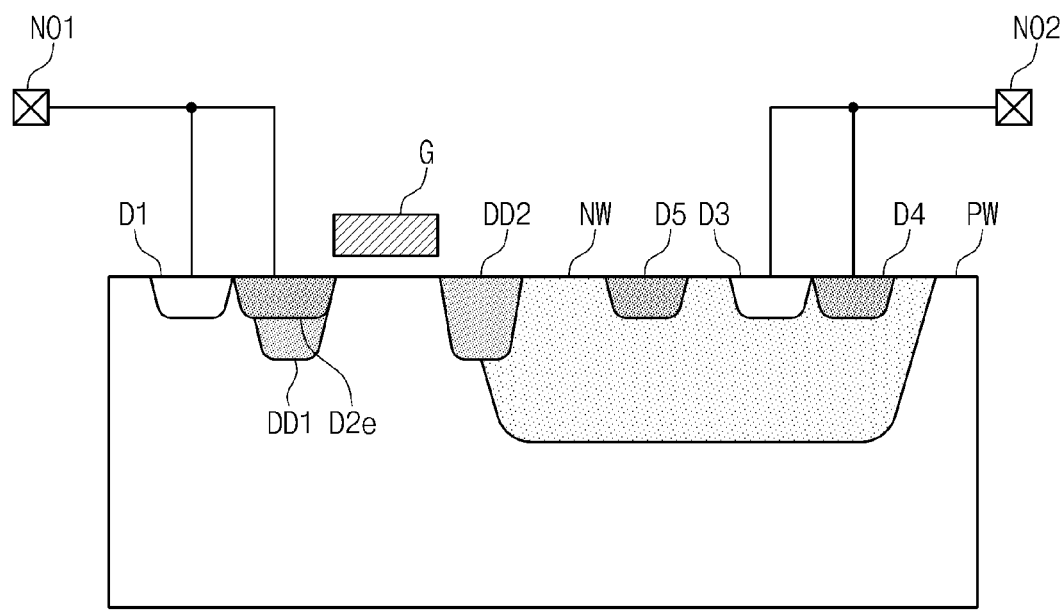
FIG. 9 is a cross sectional view taken along the line IX-IX' of FIG. 8.

In exemplary embodiments in accordance with principles of inventive concepts, as illustrated in FIGS. 6 and 7, a holding voltage, such as a can be controlled by forming at least one of the second doping region D2 and the third doping region D3 to have an island form. FIG. 8 is a top plan view illustrating a fifth exemplary embodiment of an electrostatic discharge protection circuit 100e in accordance with principles of inventive concepts. FIG. 9 is a cross sectional view taken along the line IX-IX' of FIG. 8. Comparing the electrostatic discharge protection circuit 100e with the electrostatic discharge protection circuit 100a illustrated in FIGS. 1 and 2, a second doping region D2e can extend to a region adjacent to the gate electrode G in the first conductivity type well PW. As described with reference to FIGS. 5 through 7, at least one of the second doping regions D2b and D2e and the third doping regions D3b and D3c may be provided in an island form.

Figure 10:
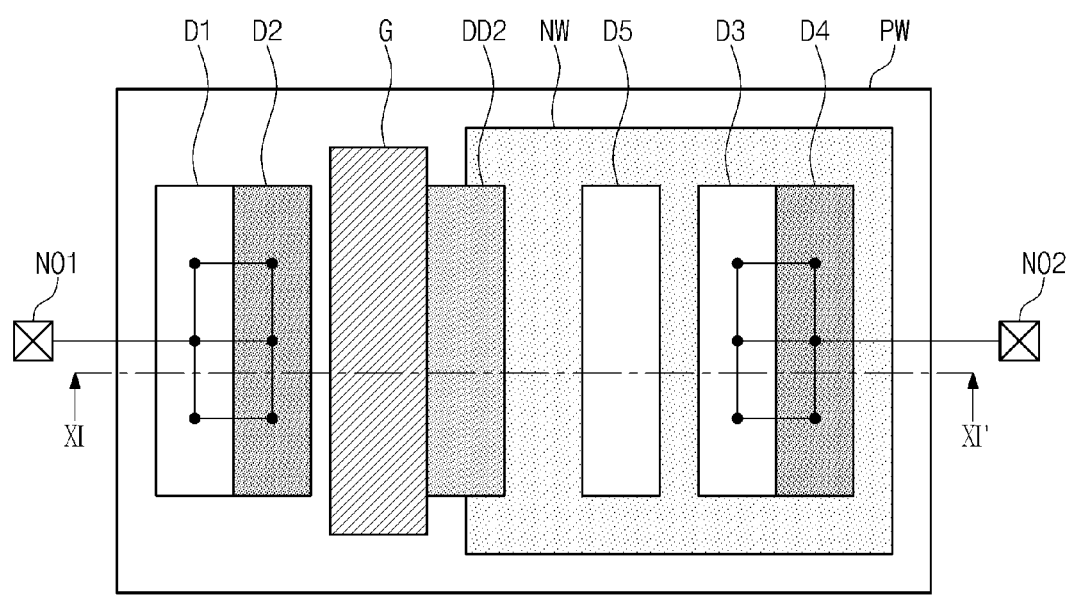
FIG. 10 is a top plan view illustrating an electrostatic discharge protection circuit in accordance with principles of inventive concepts.
Figure 11:
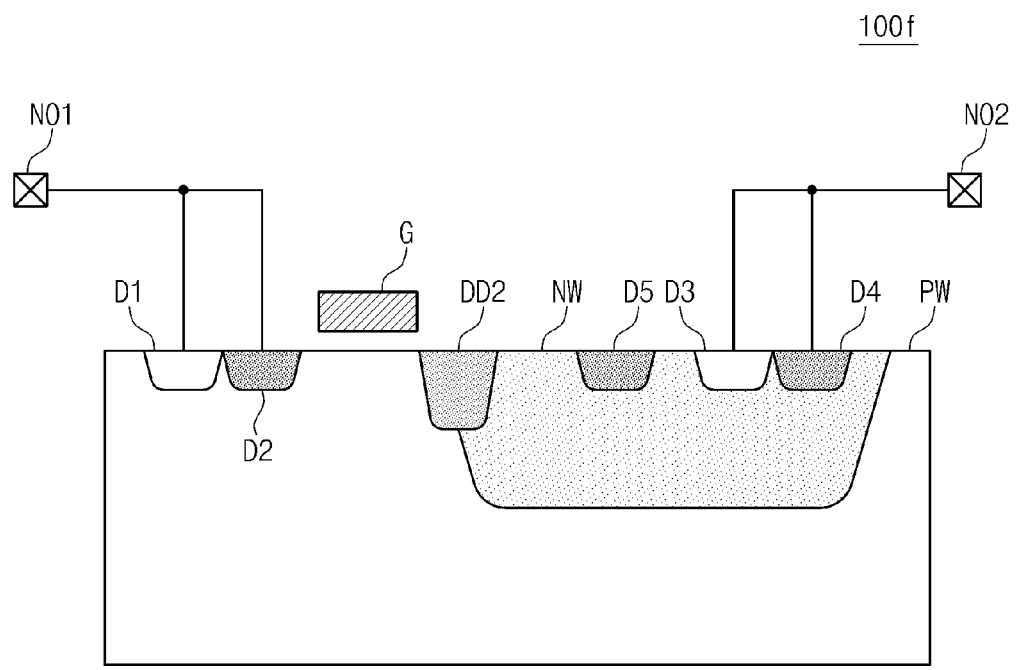
FIG. 11 is a cross sectional view taken along the line XI-XI' of FIG. 9.

FIG. 10 is a top plan view illustrating a sixth exemplary embodiment of an electrostatic discharge protection circuit 100f in accordance with principles of inventive concepts. FIG. 11 is a cross sectional view taken along the line XI-XI' of FIG. 9. Comparing the electrostatic discharge protection circuit 100f with the electrostatic discharge protection circuit 100a illustrated in FIGS. 1 and 2, a deep doping region may not be included under the second doping region D2. As described with reference to FIGS. 5 through 7, at least one of the second doping regions D2b and D2e and the third doping regions D3b and D3c may be provided in an island form.

Figure 12:
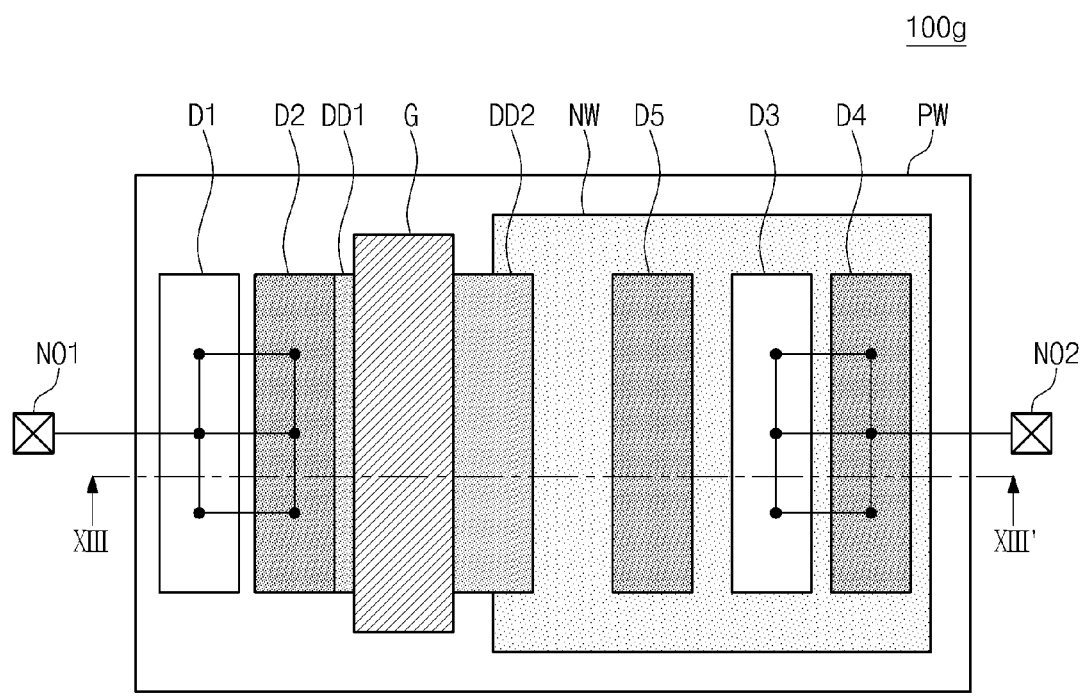
FIG. 12 is a top plan view illustrating an electrostatic discharge protection circuit in accordance with principles of inventive concepts.
Figure 13:
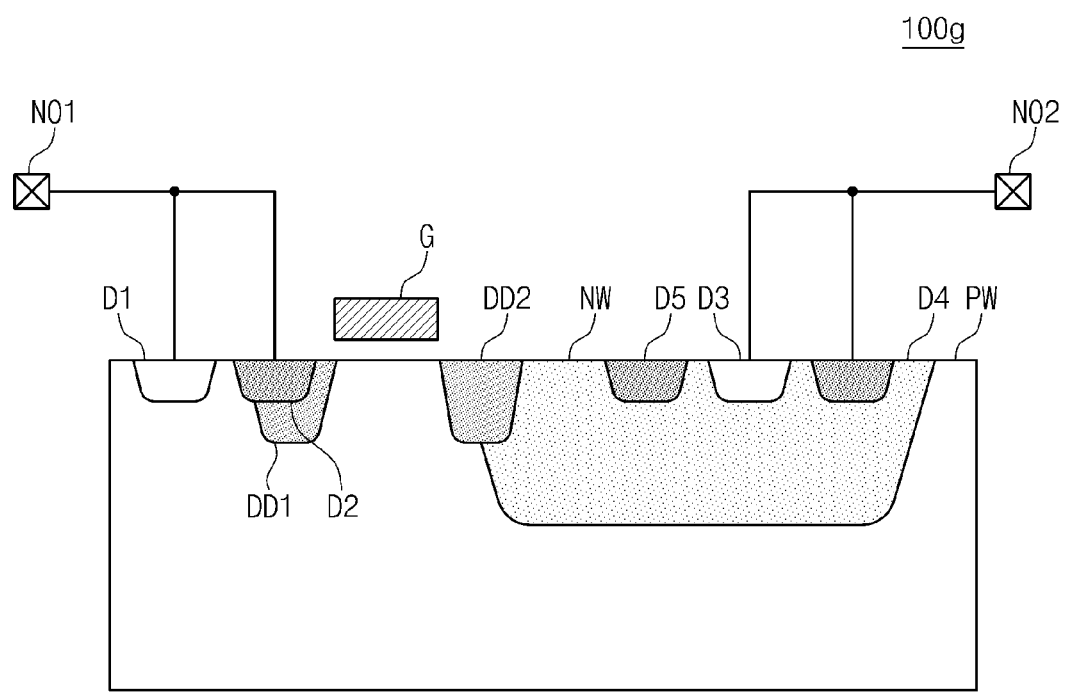
FIG. 13 is a cross sectional view taken along the line XIII-XIII' of FIG. 12.

FIG. 12 is a top plan view illustrating a seventh exemplary embodiment of an electrostatic discharge protection circuit 100g in accordance with principles of inventive concepts. FIG. 13 is a cross sectional view taken along the line XIII-XIII' of FIG. 12. Comparing the electrostatic discharge protection circuit 100g with the electrostatic discharge protection circuit 100a illustrated in FIGS. 1 and 2, the first doping region D1 and the second doping region D2 may be spaced apart from each other. Additionally, the third doping region D3 and the fourth doping region D4 may be spaced apart from each other. As described with reference to FIGS. 5 through 7, at least one of the second doping regions D2b and D2e and the third doping regions D3b and D3c may be provided in an island form. As described with reference to FIGS. 8 and 9, the second doping region D2 may extend to a part adjacent to the gate electrode G. As described with reference to FIGS. 10 and 11, the deep doping region DD1 may not be included under the second doping region D2.

Figure 14:
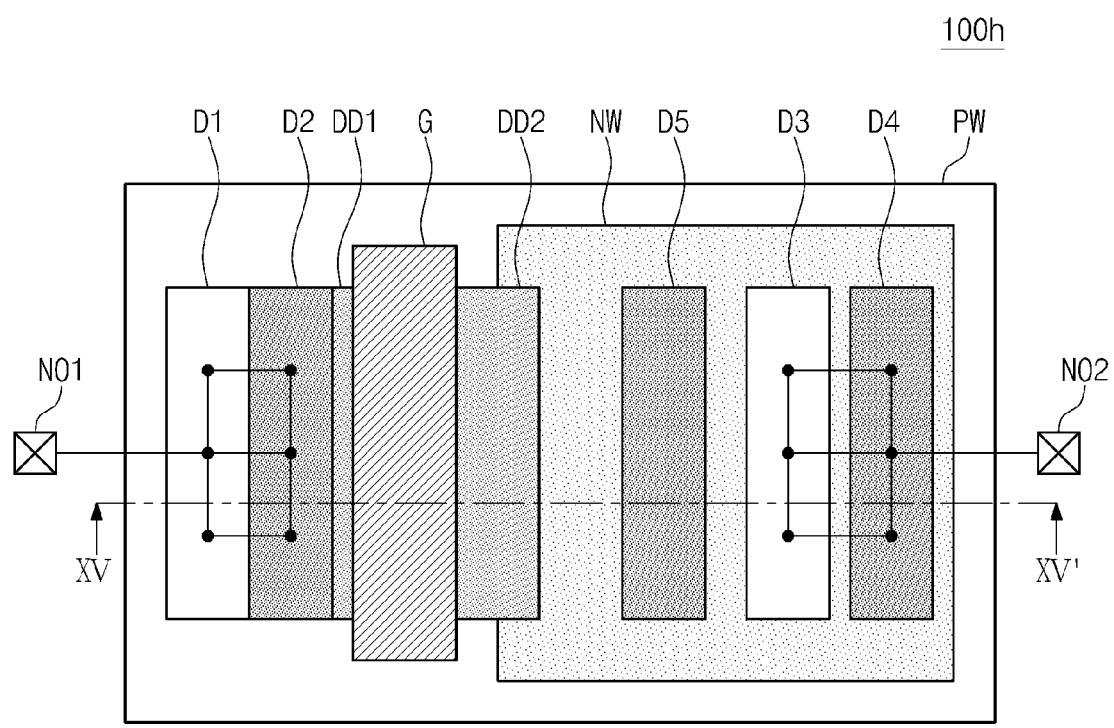
FIG. 14 is a top plan view illustrating an electrostatic discharge protection circuit in accordance with principles of inventive concepts.
Figure 15:
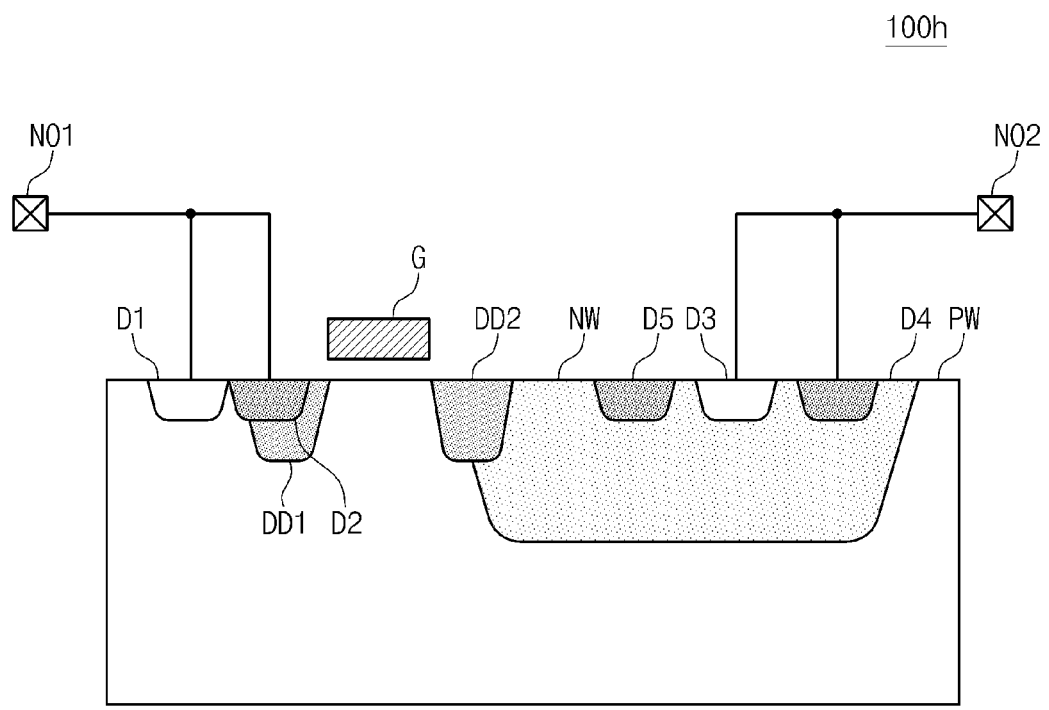
FIG. 15 is a cross sectional view taken along the line XV-XV' of FIG. 14.

FIG. 14 is a top plan view illustrating an eight exemplary embodiment of an electrostatic discharge protection circuit 100h in accordance with principles of inventive concepts. FIG. 15 is a cross sectional view taken along the line XV-XV' of FIG. 14. Comparing the electrostatic discharge protection circuit 100h with the electrostatic discharge protection circuit 100a illustrated in FIGS. 1 and 2, the third doping region D3 and the fourth doping region D4 may be spaced apart from each other. As described with reference to FIGS. 5 through 7, at least one of the second doping regions D2b and D2e and the third doping regions D3b and D3c may be provided in an island form. As described with reference to FIGS. 8 and 9, the second doping region D2 can extend to a part adjacent to the gate electrode G. As described with reference to FIGS. 10 and 11, the deep doping region DD1 may not be included under the second doping region D2.

Figure 16:
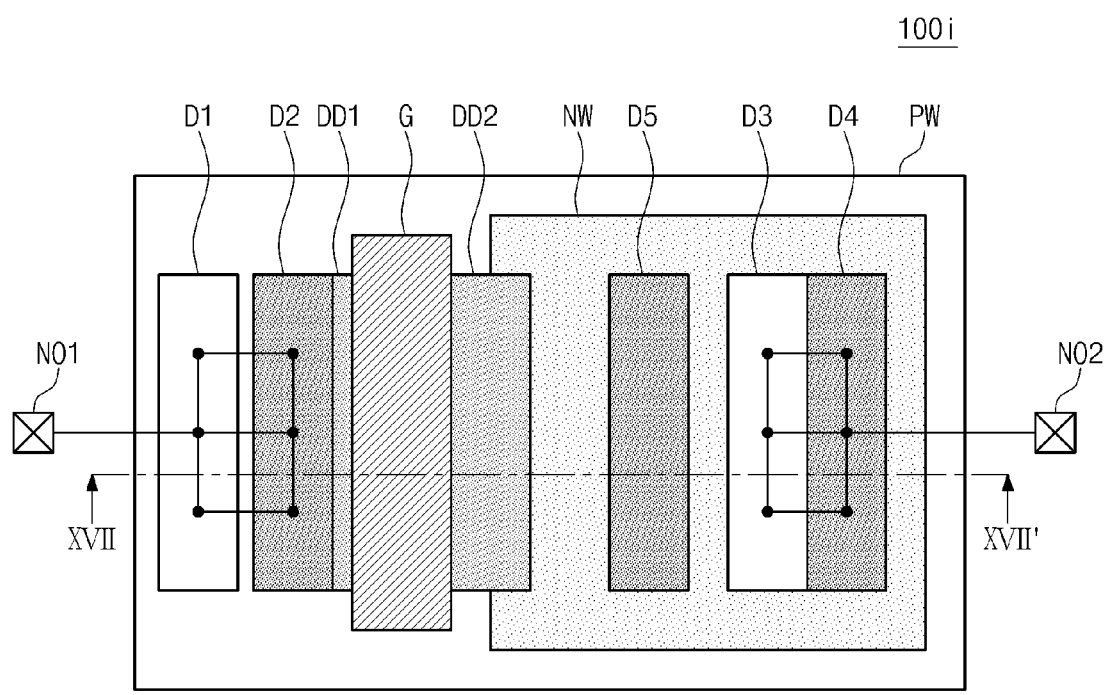
FIG. 16 is a top plan view illustrating an electrostatic discharge protection circuit in accordance with principles of inventive concepts.
Figure 17:
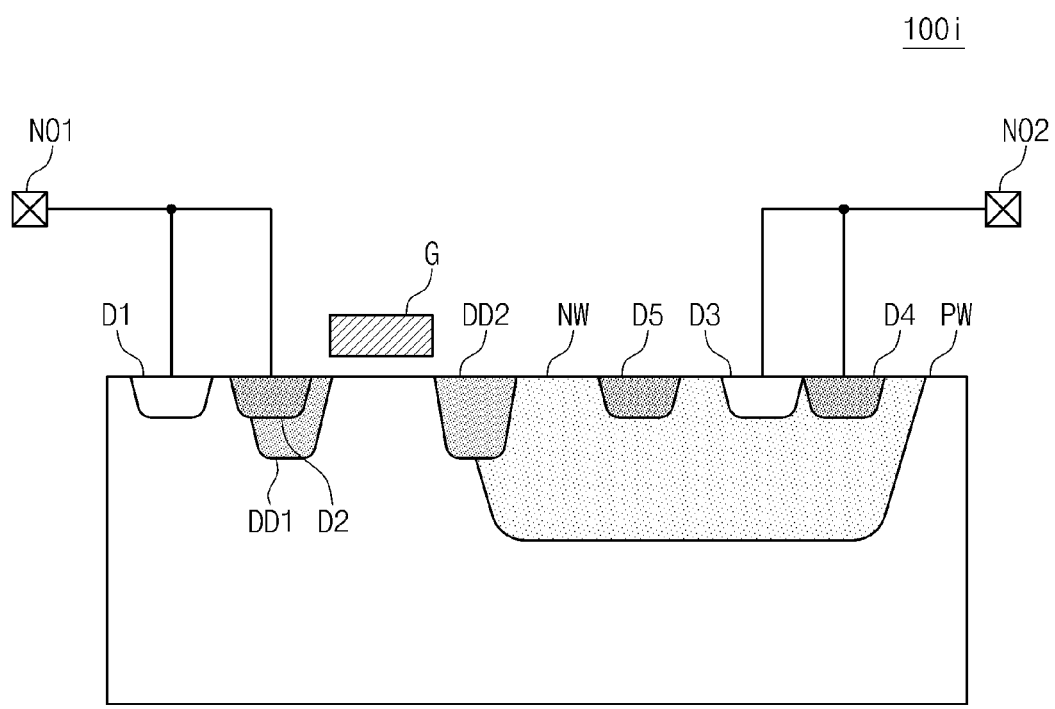
FIG. 17 is a cross sectional view taken along the line XVII-XVII' of FIG. 15.

FIG. 16 is a top plan view illustrating a ninth exemplary embodiment of an electrostatic discharge protection circuit 100i in accordance with principles of inventive concepts. FIG. 17 is a cross sectional view taken along the line XVII-XVII' of FIG. 16. Comparing the electrostatic discharge protection circuit 100i with the electrostatic discharge protection circuit 100a illustrated in FIGS. 1 and 2, the first doping region D1 and the second doping region D2 may be spaced apart from each other. As described with reference to FIGS. 5 through 7, at least one of the second doping regions D2b and D2e and the third doping regions D3b and D3c may be provided in an island form. As described with reference to FIGS. 8 and 9, the second doping region D2 can extend to a part adjacent to the gate electrode G. As described with reference to FIGS. 10 and 11, the deep doping region DD1 may not be included under the second doping region D2.

Figure 18:
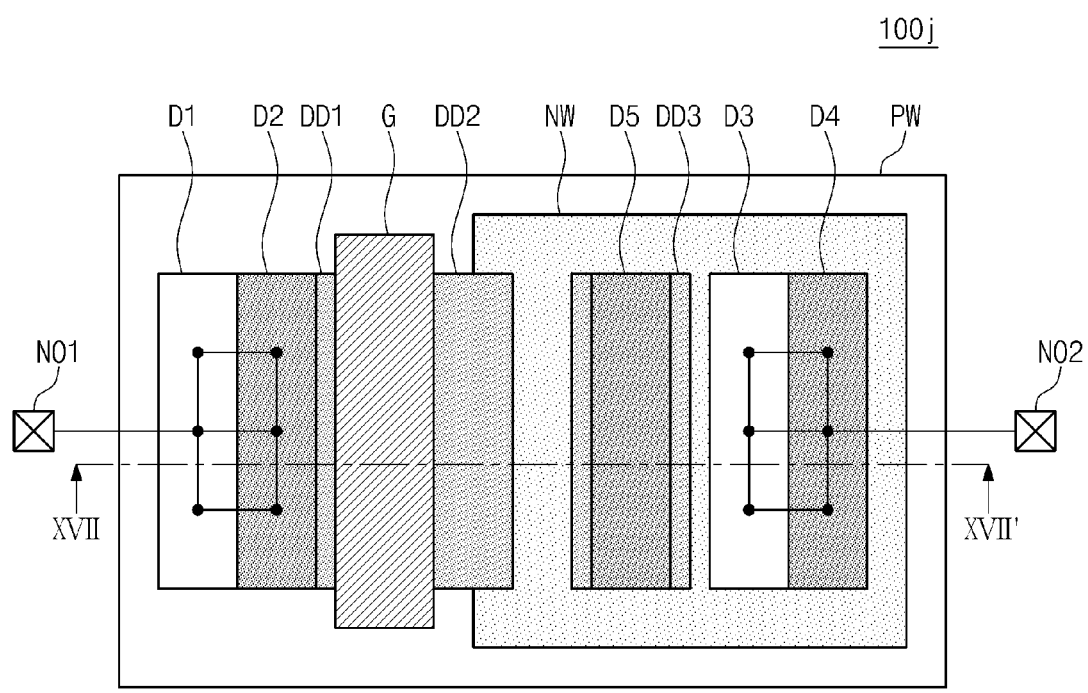
FIG. 18 is a top plan view illustrating an electrostatic discharge protection circuit in accordance with principles of inventive concepts.
Figure 19:
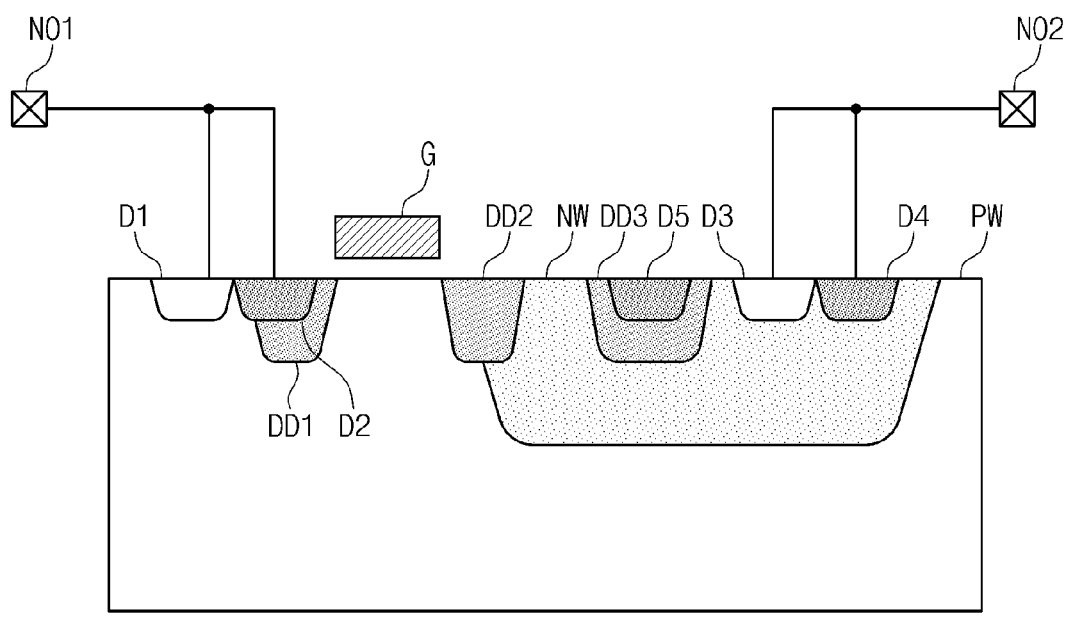
FIG. 19 is a cross sectional view taken along the line XIX-XIX' of FIG. 18.

FIG. 18 is a top plan view illustrating a tenth exemplary embodiment of an electrostatic discharge protection circuit 100j in accordance with principles of inventive concepts. FIG. 19 is a cross sectional view taken along the line XIX-XIX' of FIG. 18. Comparing the electrostatic discharge protection circuit 100j with the electrostatic discharge protection circuit 100a illustrated in FIGS. 1 and 2, a deep doping region DD3 may be provided under the fifth doping region D5. As described with reference to FIGS. 5 through 7, at least one of the second doping regions D2b and D2e and the third doping regions D3b and D3c may be provided in an island form. As described with reference to FIGS. 8 and 9, the second doping region D2 can extend to a part adjacent to the gate electrode G. As described with reference to FIGS. 10 and 11, the deep doping region DD1 may not be included under the second doping region D2. As described with reference to FIGS. 12 through 17, at least one group of a group of the first and second doping regions D1 and D2 and a group of the third and fourth doping regions D3 and D4 may be spaced apart from each other.

Figure 20:
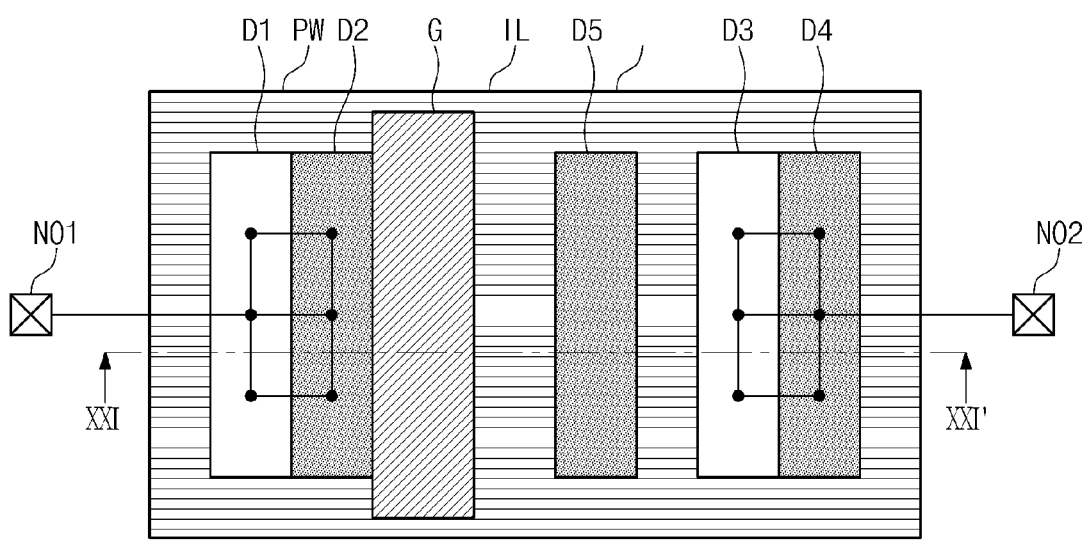
FIG. 20 is a top plan view illustrating an electrostatic discharge protection circuit in accordance with principles of inventive concepts.
Figure 21:
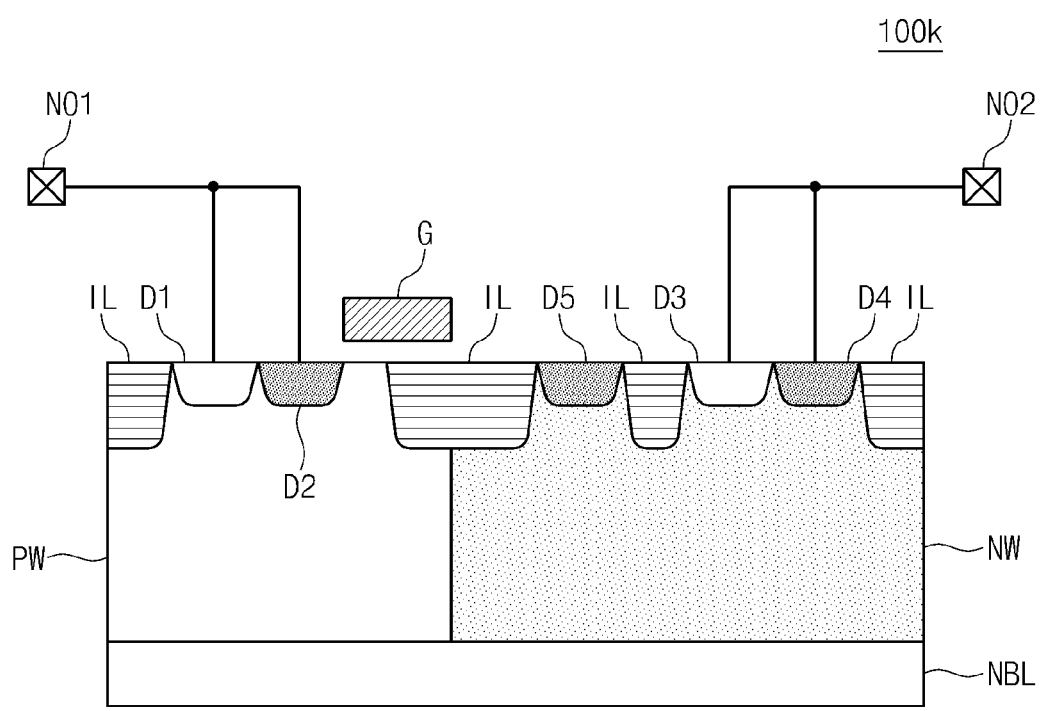
FIG. 21 is a cross sectional view taken along the line XXI-XXI' of FIG. 20.

FIG. 20 is a top plan view illustrating an eleventh exemplary embodiment of an electrostatic discharge protection circuit 100k in accordance with principles of inventive concepts. FIG. 21 is a cross sectional view taken along the line XXI-XXI' of FIG. 20. Comparing the electrostatic discharge protection circuit 100k with the electrostatic discharge protection circuit 100a illustrated in FIGS. 1 and 2, the first conductivity type well PW and the second conductivity type well NW may be provided on an N conductivity type buried layer NBL. The first conductivity type well PW and the second conductivity type well NW may be in contact with each other.

Device isolation layers IL may be provided in the first conductivity type well PW adjacent to the first doping region D1, at an interface between the first conductivity type well PW and the second conductivity type well NW disposed under the gate electrode G, in the second conductivity type well NW between the third doping region D3 and the fifth doping region D5 and in the second conductivity type well NW adjacent to the fourth doping region D4 respectively. The device isolation layers IL may be formed on the basis of shallow trench isolation STI or a local oxidation of silicon (LOCOS), for example. The existence and location of the N conductivity type buried layer NBL are not limited to illustrated exemplary embodiments. The N conductivity type buried layer NBL may not be included or a part of the N conductivity type buried layer NBL may be provided, for example.

As described with reference to FIGS. 5 through 7, at least one of the second doping regions D2b and D2e and the third doping regions D3b and D3c may be provided in an island form. As described with reference to FIGS. 12 through 17, at least one group of a group of the first and second doping regions D1 and D2 and a group of the third and fourth doping regions D3 and D4 may be spaced apart from each other. As described with reference to FIGS. 18 and 19, a deep doping region may be provided under the fifth doping region D5.

Figure 22:
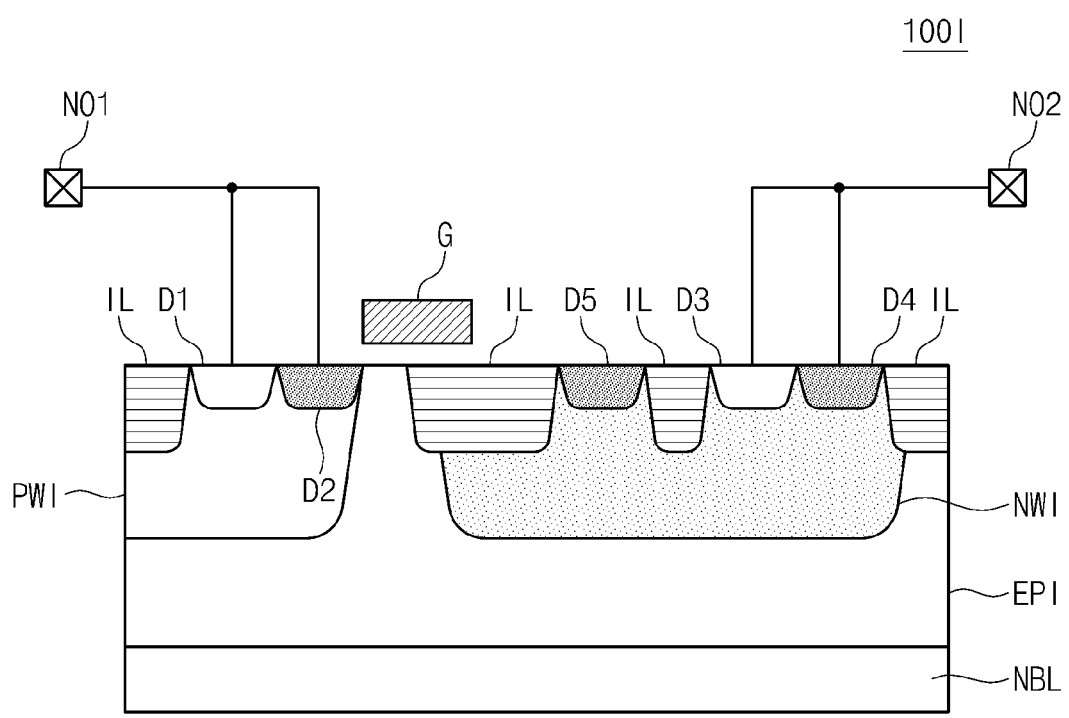
FIG. 22 is another example (eleventh embodiment) of a cross sectional view taken along the line XXI-XXI' of FIG. 20.

FIG. 22 is another example of a cross sectional view taken along the line XXI-XXI' of FIG. 20. Comparing the electrostatic discharge protection circuit 100l with the electrostatic discharge protection circuit 100a illustrated in FIGS. 1 and 2, an epitaxial layer (EPI) is provided on the N conductivity type buried layer NBL. The epitaxial layer (EPI) may have an N conductivity type, for example.

The first conductivity type well PW and the second conductivity type well NW are provided on the epitaxial layer (EPI) and the first and second conductivity type wells PW and NW may be electrically connected to each other.

The epitaxial layer (EPI) may form a well having an N conductivity type together with the second conductivity type well NW. The first conductivity type well PW may be formed in a well having an N conductivity type.

Device isolation layers IL may be provided in the first conductivity type well PW adjacent to the first doping region D1, at an interface between the epitaxial layer (EPI) and the second conductivity type well NW disposed under the gate electrode G, in the second conductivity type well NW between the third doping region D3 and the fifth doping region D5 and in the second conductivity type well NW adjacent to the fourth doping region D4 respectively. The device isolation layers IL may be formed on the basis of shallow trench isolation STI or a local oxidation of silicon (LOCOS), for example.

The existence and location of the N conductivity type buried layer NBL are not limited to illustrated exemplary embodiments. The N conductivity type buried layer NBL may not be included or a part of the N conductivity type buried layer NBL may be provided, for example.

As described with reference to FIGS. 5 through 7, at least one of the second doping regions D2b and D2e and the third doping regions D3b and D3c may be provided in an island form. As described with reference to FIGS. 12 through 17, at least one group of a group of the first and second doping regions D1 and D2 and a group of the third and fourth doping regions D3 and D4 may be spaced apart from each other. As described with reference to FIGS. 18 and 19, a deep doping region may be provided under the fifth doping region D5.

Figure 23:
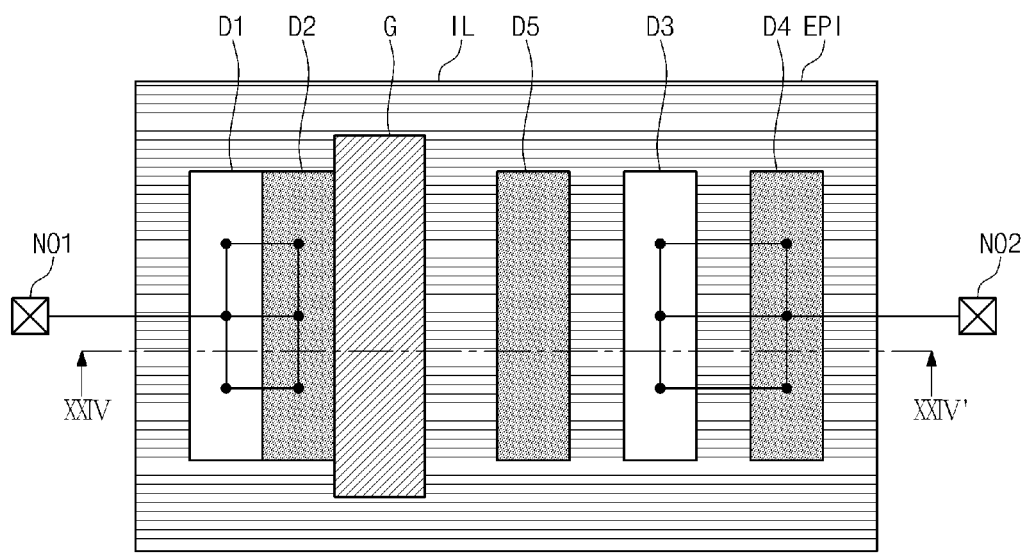
FIG. 23 is a top plan view illustrating an electrostatic discharge protection circuit in accordance with principles of inventive concepts.
Figure 24:
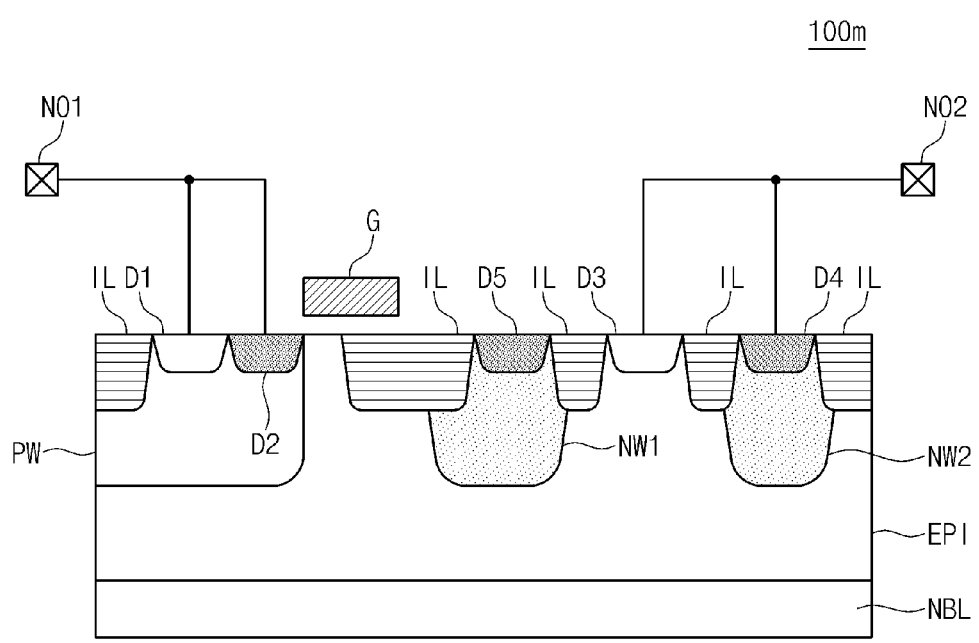
FIG. 24 is a cross sectional view taken along the line XXIV-XXIV' of FIG. 23.

FIG. 23 is a top plan view illustrating a twelfth exemplary embodiment of an electrostatic discharge protection circuit 100m in accordance with principles of inventive concepts. FIG. 24 is a cross sectional view taken along the line XXIV-XXIV' of FIG. 23. Comparing the electrostatic discharge protection circuit 100m with the electrostatic discharge protection circuit 100l described with reference to FIGS. 22 and 23, one first conductivity type well PW and two second conductivity type wells NW1 and NW2 may be provided on the epitaxial layer (EPI). The fourth doping region D4 may be formed in the second conductivity type well NW2. The fifth doping region D5 may be formed in the second conductivity type well NW1. The third and fourth doping regions D3 and D4 may be separated by a device isolation layer IL.

The epitaxial layer (EPI) may form one well having an N conductivity type together with the second conductivity type wells NW1 and NW2. The first conductivity type well PW may be formed in one well having an N conductivity type. The existence and location of the N conductivity type buried layer NBL are not limited to illustrated exemplary embodiments. The N conductivity type buried layer NBL may not be provided or a part of the N conductivity type buried layer NBL may be provided. As described with reference to FIGS. 5 through 7, at least one of the second doping regions D2b and D2e and the third doping regions D3b and D3c may be provided in an island form. As described with reference to FIGS. 12 through 17, at least one group of a group of the first and second doping regions D1 and D2 and a group of the third and fourth doping regions D3 and D4 may be spaced apart from each other. As described with reference to FIGS. 18 and 19, a deep doping region may be provided under the fifth doping region D5.

Figure 25:
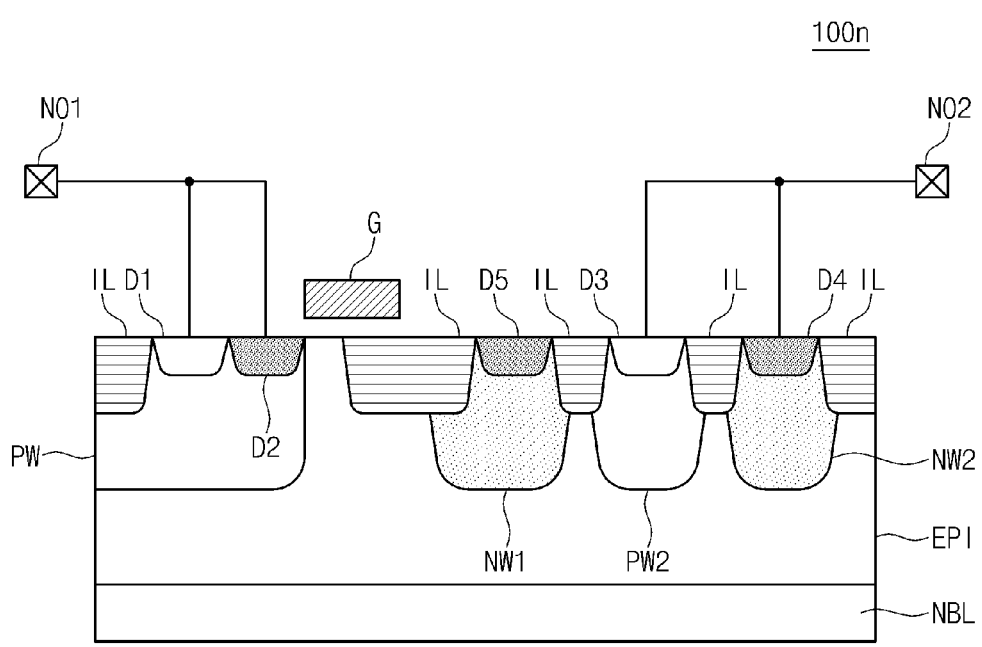
FIG. 25 is another example (thirteenth embodiment) of a cross sectional view taken along the line XXIV-XXIV' of FIG. 23.

FIG. 25 is another example of a cross sectional view taken along the line XXIV-XXIV' of FIG. 23. Comparing the electrostatic discharge protection circuit 100n with the electrostatic discharge protection circuit 100m described with reference to FIGS. 23 and 34, a first conductivity type well PW2 may be additionally provided. The third doping region D3 may be formed in the first conductivity type well PW2. The doping concentration of the first conductivity type well PW2 may be lower than the doping concentration of the third doping region D3.

The epitaxial layer (EPI) may form one well having an N conductivity type together with the second conductivity type wells NW1 and NW2. The first conductivity type wells PW and PW2 may be formed in one well having an N conductivity type. The first conductivity type well PW2 may form one doping region together with the third doping region D3. The one doping region may be formed in one well having an N conductivity type.

As described with reference to FIGS. 5 through 7, at least one of the second doping regions D2b and D2e and the third doping regions D3b and D3c may be provided in an island form. As described with reference to FIGS. 12 through 17, at least one group of a group of the first and second doping regions D1 and D2 and a group of the third and fourth doping regions D3 and D4 may be spaced apart from each other. As described with reference to FIGS. 18 and 19, a deep doping region may be provided under the fifth doping region D5.

Figure 26:
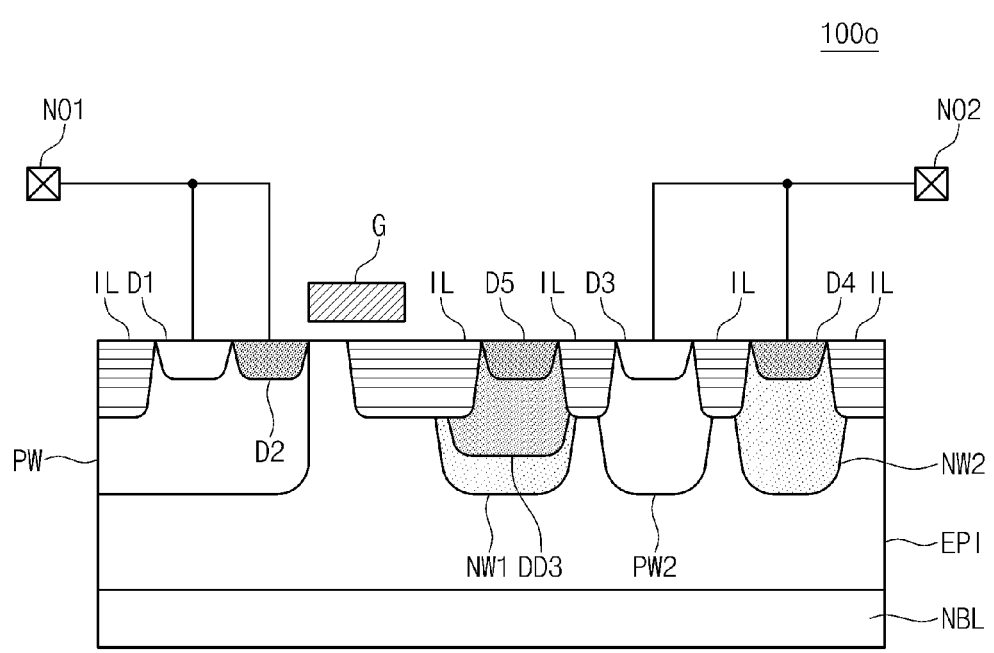
FIG. 26 is a cross sectional view illustrating an electrostatic discharge protection circuit in accordance with principles of inventive concepts.

FIG. 26 is a cross sectional view illustrating a fourteenth exemplary embodiment of an electrostatic discharge protection circuit 100o in accordance with principles of inventive concepts. A top plan view of the electrostatic discharge protection circuit 100o may be the same as the top plan view illustrated in FIG. 23. Referring to FIG. 26, a deep doping region DD3 may be provided under the fifth doping region D5. The deep doping region DD3 may have an N conductivity type. The doping concentration of the deep doping region DD3 may be lower than the doping concentration of the fifth doping region D5 and may be higher than the doping concentration of the second conductivity type well NW1.

The existence and location of the N conductivity type buried layer NBL are not limited to illustrated exemplary embodiments. The N conductivity type buried layer NBL may not be provided or a part of the N conductivity type buried layer NBL may be provided, for example. As described with reference to FIGS. 5 through 7, at least one of the second doping regions D2b and D2e and the third doping regions D3b and D3c may be provided in an island form. As described with reference to FIGS. 12 through 17, at least one group of a group of the first and second doping regions D1 and D2 and a group of the third and fourth doping regions D3 and D4 may be spaced apart from each other.

Figure 27:
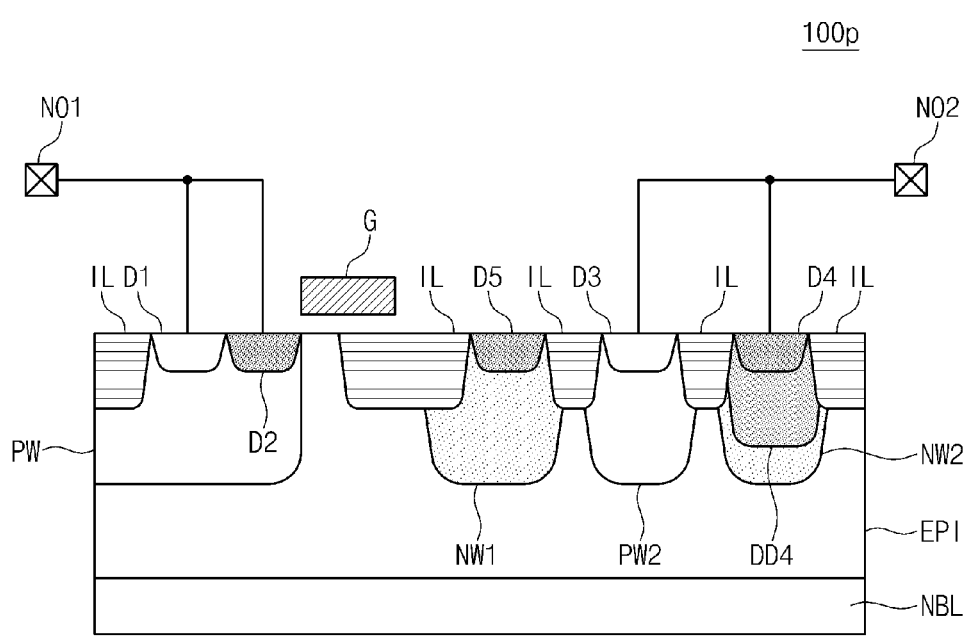
FIG. 27 is a cross sectional view illustrating an electrostatic discharge protection circuit in accordance with principles of inventive concepts.

FIG. 27 is a cross sectional view illustrating a fifteenth exemplary embodiment of an electrostatic discharge protection circuit 100p in accordance with principles of inventive concepts. A top plan view of the electrostatic discharge protection circuit 100p may be the same as the top plan view illustrated in FIG. 23. Referring to FIG. 27, a deep doping region DD4 may be provided under the fourth doping region D4. The deep doping region DD4 may have an N conductivity type. The doping concentration of the deep doping region DD4 may be lower than the doping concentration of the fourth doping region D4 and may be higher than the doping concentration of the second conductivity type well NW2, for example.

The existence and location of the N conductivity type buried layer NBL are not limited to illustrated exemplary embodiments. The N conductivity type buried layer NBL may not be provided or a part of the N conductivity type buried layer NBL may be provided, for example. As described with reference to FIGS. 5 through 7, at least one of the second doping regions D2b and D2e and the third doping regions D3b and D3c may be provided in an island form. As described with reference to FIGS. 12 through 17, at least one group of a group of the first and second doping regions D1 and D2 and a group of the third and fourth doping regions D3 and D4 may be spaced apart from each other.

Figure 28:
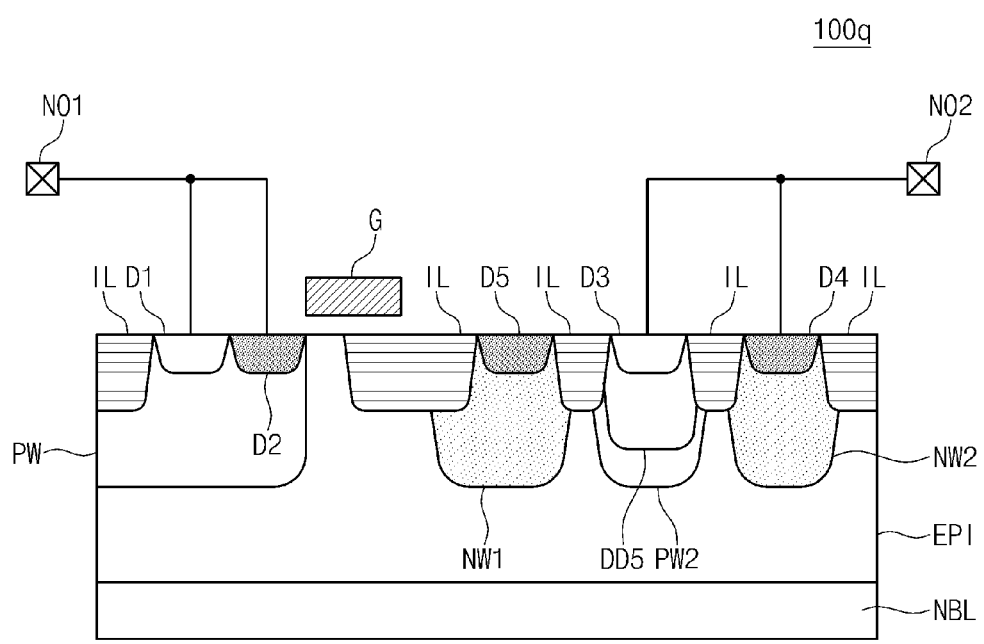
FIG. 28 is a cross sectional view illustrating an electrostatic discharge protection circuit in accordance with principles of inventive concepts.

FIG. 28 is a cross sectional view illustrating fifteenth exemplary embodiment of an electrostatic discharge protection circuit 100q in accordance with principles of inventive concepts. A top plan view of the electrostatic discharge protection circuit 100q may be the same as the top plan view illustrated in FIG. 23. Referring to FIG. 28, a deep doping region DD5 may be provided under the third doping region D3. The deep doping region DD5 may have a P conductivity type. The doping concentration of the deep doping region DD5 may be lower than the doping concentration of the third doping region D3 and may be higher than the doping concentration of the first conductivity type well PW2.

The existence and location of the N conductivity type buried layer NBL are not limited to illustrated exemplary embodiments. The N conductivity type buried layer NBL may not be provided or a part of the N conductivity type buried layer NBL may be provided, for example. As described with reference to FIGS. 5 through 7, at least one of the second doping regions D2b and D2e and the third doping regions D3b and D3c may be provided in an island form. As described with reference to FIGS. 12 through 17, at least one group of a group of the first and second doping regions D1 and D2 and a group of the third and fourth doping regions D3 and D4 may be spaced apart from each other.

Figure 29:
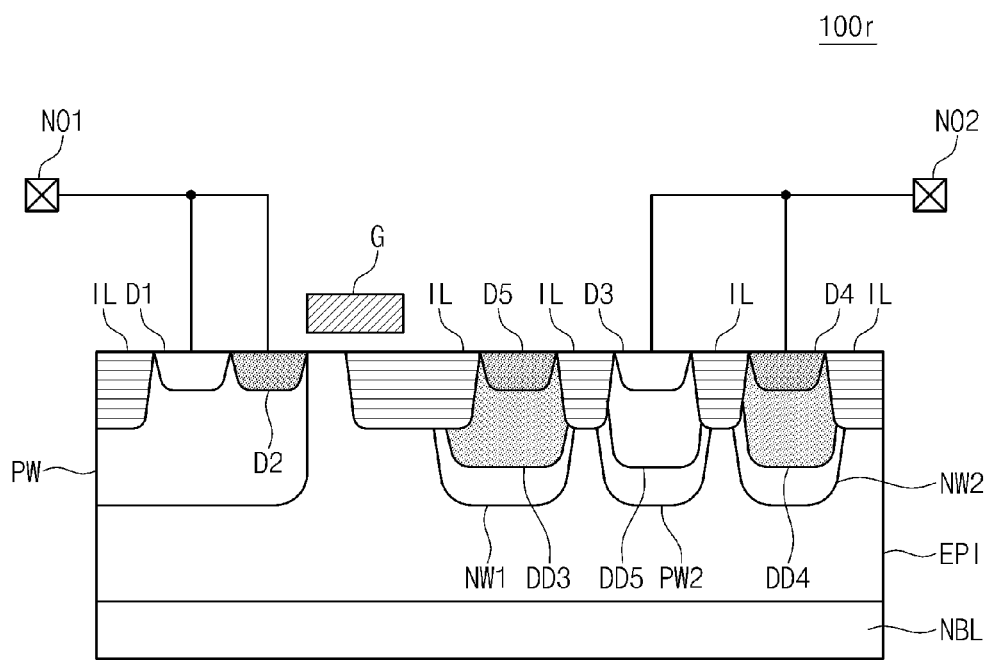
FIG. 29 is a cross sectional view illustrating an electrostatic discharge protection circuit in accordance with principles of inventive concepts.

FIG. 29 is a cross sectional view illustrating a fifteenth exemplary embodiment of an electrostatic discharge protection circuit 100r in accordance with principles of inventive concepts. A top plan view of the electrostatic discharge protection circuit 100r may be the same as the top plan view illustrated in FIG. 23. Referring to FIG. 29, the deep doping region DD5 may be provided under the third doping region D3, the deep doping region DD4 may be provided under the fourth doping region D4 and the deep doping region DD3 may be provided under the fifth doping region D5.

The existence and location of the N conductivity type buried layer NBL are not limited to illustrated exemplary embodiments. The N conductivity type buried layer NBL may not be provided or a part of the N conductivity type buried layer NBL may be provided, for example.

As described with reference to FIGS. 5 through 7, at least one of the second doping regions D2b and D2e and the third doping regions D3b and D3c may be provided in an island form. As described with reference to FIGS. 12 through 17, at least one group of a group of the first and second doping regions D1 and D2 and a group of the third and fourth doping regions D3 and D4 may be spaced apart from each other.

Figure 30:
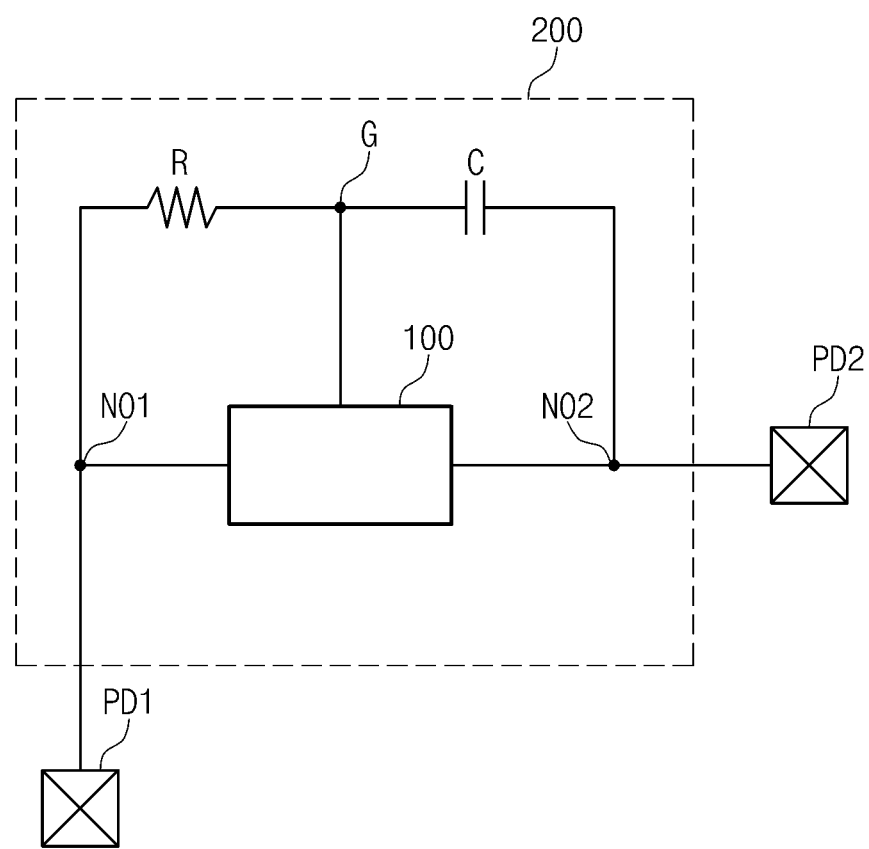
FIG. 30 is a drawing illustrating an electrostatic discharge protection device in accordance with another embodiment to which the electrostatic discharge protection device in accordance with principles of inventive concepts is applied.

FIG. 30 is a drawing illustrating an electrostatic discharge protection device, or circuit, 200 in accordance with principles of inventive concepts that includes an electrostatic discharge protection device, or part, in accordance with an embodiment of inventive concepts. Referring to FIG. 30, the electrostatic discharge protection device 200 includes an electrostatic discharge protection part 100, a resistor R and a capacitor C.

The electrostatic discharge protection part 100 may include at least one of the electrostatic discharge protection devices 100a through 100r in accordance with an exemplary embodiment in accordance with principles of inventive concepts. A first electrode N01, second electrode N02 and gate electrode G of the electrostatic discharge protection part 100 may correspond to the first electrode N01, second electrode N02 and gate electrode G described with reference to FIGS. 1 through 31 respectively.

In this exemplary embodiment, resistor R is connected between the gate electrode G and first electrode N01 of the electrostatic discharge protection part 100. Capacitor C is connected between the gate electrode G and second electrode N02 of the electrostatic discharge protection part 100. Second electrode N02 is connected to a pad PD2 for protecting an electrostatic discharge and the first electrode N01 is connected to a pad PD1 for leaking, or bleeding, an electrostatic discharge, for example, a ground pad.

The electrostatic discharge protection part 100, the capacitor C and the resistor R may be integrated into one electrostatic discharge protection device in accordance with principles of inventive concepts.

Figure 31:
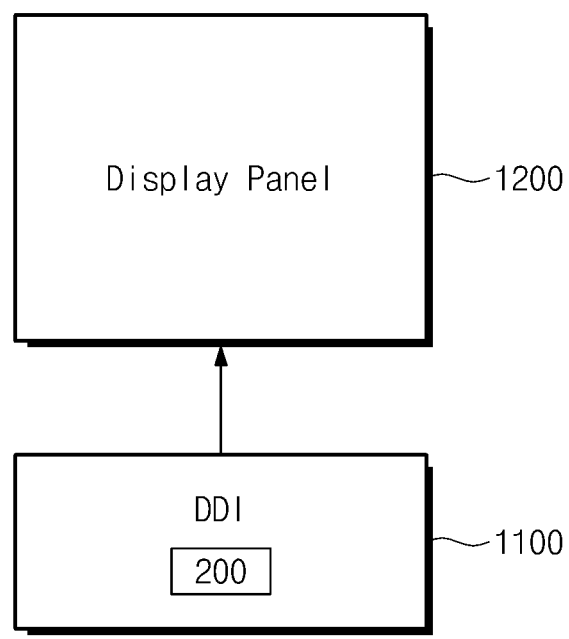
FIG. 31 is a block diagram illustrating a display device in accordance with principles of inventive concepts.

FIG. 31 is a block diagram illustrating an exemplary embodiment of a display device 1000 in accordance with principles of inventive concepts. Display device 1000 includes a display drive part 1100 and a display panel 1200. The display drive part 1100 may include a gate driver and a source driver for controlling pixels of the display panel 1200. The display panel 1200 may include a plurality of pixels.

The display driver part 1100 may include an electrostatic discharge protection device 200 in accordance with principles of inventive concepts. The electrostatic discharge protection device 200 can be adopted in various parts of the display drive part 1100 to prevent the display drive part 1100 from incorrectly operating or being damaged due to an electrostatic discharge, for example.

Figure 32:
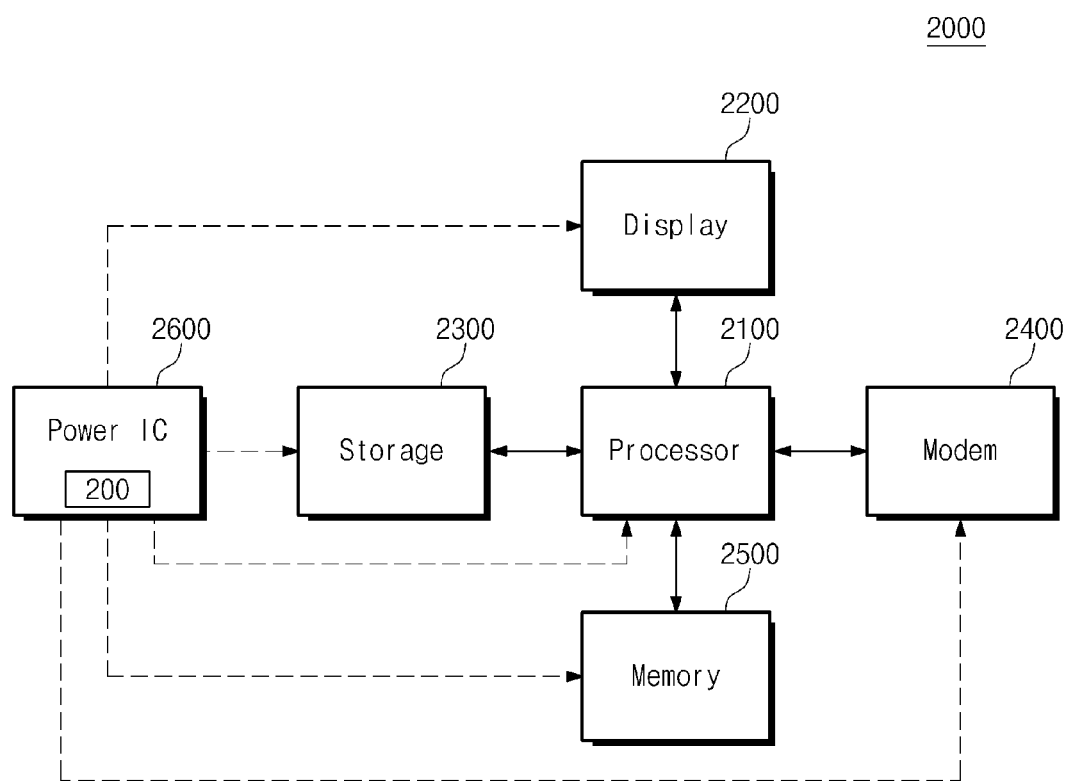
FIG. 32 is a block diagram illustrating a computing device in accordance with principles of inventive concepts.

FIG. 32 is a block diagram illustrating an exemplary embodiment of a computing device 2000 in accordance with principles of inventive concepts. Computing device 2000 includes a processor 2100, a display 2200, storage 2300, a modem 2400 and a memory 2500.

The processor 2100 may include a general-purpose processor or an application processor. The display 2200 may include an LCD, an AMOLED display, a CRT monitor, a beam projector, etc. The storage 2300 may include a solid state drive, a hard disk drive, etc. including a nonvolatile memory such as a flash memory, RRAM, MRAM, PRAM, FRAM, etc. The modem 2400 can perform a wire or wireless communication with an external device. The memory 2500 may be an operation memory of the computing device 2000. The memory 2500 may include a volatile memory such as DRAM, SRAM, etc. or a nonvolatile memory such as a flash memory, RRAM, MRAM, PRAM, FRAM, etc.

In embodiments in which the storage 2300 and the memory 2500 are constituted by the same kind of nonvolatile memory, the storage 2300 and the memory 2500 may be integrated into one storage medium.

A power supply IC 2600 is configured to manage a power supply being supplied to constituent elements of the computing device 2000. The power supply IC 2600 may include a semiconductor integration circuit, for example, and may include an electrostatic discharge protection device 200 in accordance with principles of inventive concepts. The electrostatic discharge protection device 200 can be adopted in various parts of the power supply IC 2600 to prevent the power supply IC 2600 and the computing device 2000 from incorrectly operating or being damaged due to an electrostatic discharge, for example. The device 2000 may also include a wireless connection and may be applied to a notebook computer, a tablet computer, a portable device, an MP3, player, a television, or cellular telephone, for example.

Figure 33:
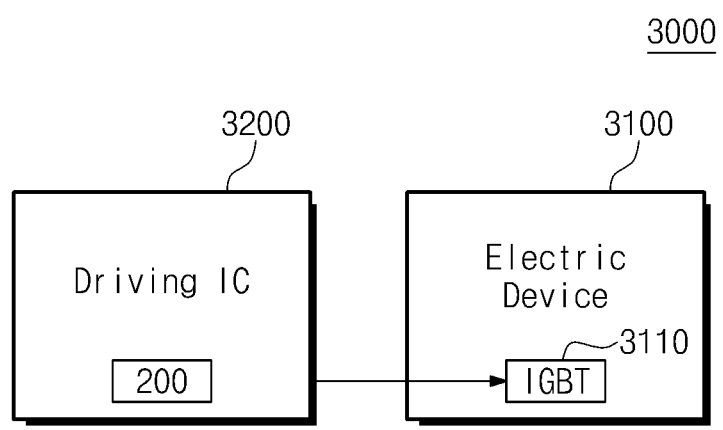
FIG. 33 is a block diagram illustrating an electrical system in accordance with principles of inventive concepts.

FIG. 33 is a block diagram illustrating an exemplary embodiment of an electrical system 3000 in accordance with principles of inventive concepts. Electrical system 3000 includes an electrical device 3100 and a drive IC 3200.

The electrical device 3100 may be a device using a high voltage or a high current. The electrical device 3100 may include a motor using a high voltage or a high current. In exemplary embodiments in accordance with principles of inventive concepts, electrical device 3100 includes an integrated gate bipolar transistor (IGBT) 3110 for controlling a high voltage or a high current.

The drive IC 3200 is configured to control the IGBT 3110 of the electrical device 3100. The drive IC 3200 may be a semiconductor integration circuit. The drive IC 3200 includes an electrostatic discharge protection device 200 in accordance with principles of inventive concepts. The electrostatic discharge protection device 200 can be adopted in various parts of the drive IC 3200 to prevent the drive IC 3200 from incorrectly operating or being damaged due to an electrostatic discharge.

According to some embodiments of the inventive concept, an electrostatic discharge protection device has a high holding voltage, similar to that of a power supply voltage. As a result, even when an electrostatic discharge occurs, a normal voltage level is maintained for circuits and the reliability of the circuit is maintained even as an electrostatic discharge is being accommodated.

Having described the exemplary embodiments of the inventive concept, it is further noted that various modifications may be made without departing from the spirit and scope of the inventive concept, which is defined by the metes and bounds of the appended claims.

What is claimed is:
1. An electrostatic discharge protection device comprising:
   a first conductivity type well;
   a second conductivity type well in contact with the first conductivity type well;
   first and second doping regions formed in the first conductivity type well, connected to a first electrode in common and having different conductivity types from each other;

third and fourth doping regions formed in the second conductivity type well, connected to a second electrode in common and having different conductivity types from each other; and a fifth doping region formed in the second conductivity type well between the first and second doping regions and the third and fourth doping regions, the fifth doping region being electrically isolated from conductive paths that are external to the electrostatic discharge protection device.

2. The electrostatic discharge protection device of claim 1, wherein the first conductivity type well is a P conductivity type well.

3. The electrostatic discharge protection device of claim 1, wherein the second conductivity type well is an N conductivity type well.

4. The electrostatic discharge protection device of claim 1, wherein the second doping region is between the first doping region and the fifth doping region, and wherein the first doping region is a P conductivity type and the second doping region is an N conductivity type.

5. The electrostatic discharge protection device of claim 4, wherein the second doping region includes a plurality of doping regions spaced apart from one another and the plurality of doping regions spaced apart from one another are connected to the first electrode in common.

6. The electrostatic discharge protection device of claim 1, wherein the third doping region is between the fourth doping region and the fifth doping region, and wherein the third doping region is a P conductivity type and the fourth doping region is an N conductivity type.

7. The electrostatic discharge protection device of claim 6, wherein the third doping region includes a plurality of doping regions spaced apart from one another and the plurality of doping regions spaced apart from one another are connected to the second electrode in common.

8. The electrostatic discharge protection device of claim 1, wherein the fifth doping region is an N conductivity type.

9. The electrostatic discharge protection device of claim 1, wherein the second conductivity type well is formed in the first conductivity type well.

10. The electrostatic discharge protection device of claim 1, wherein the fifth doping region is spaced apart from the third and fourth doping regions.

11. The electrostatic discharge protection device of claim 1, further comprising a device isolation layer formed at an interface between the first conductivity type well and the second conductivity type well.

12. The electrostatic discharge protection device of claim 1, further comprising a device isolation layer between the fifth doping region and the third doping region and between the fifth doping region and the fourth doping region.

13. The electrostatic discharge protection device of claim 1, further comprising a gate electrode electrically isolated from the first conductivity type well on the first conductivity type well adjacent to an interface between the first and second conductivity type wells.

14. An electrostatic discharge protection device comprising:

a semiconductor device including a first electrode, a second electrode and a gate electrode;

a capacitor connected between the second electrode and the gate electrode; and a resistor connected between the gate electrode and the first electrode, wherein the semiconductor device comprises:

a first conductivity type well;

a second conductivity type well in contact with the first conductivity type well;

first and second doping regions formed in the first conductivity type well, connected in common to form the first electrode and having different conductivity types from each other;

third and fourth doping regions formed in the second conductivity type well, connected in common to form the second electrode and having different conductivity types from each other;

a fifth doping region in the second conductivity type well between the first and second doping regions and the third and fourth doping regions, the fifth doping region being electrically isolated from conductive paths that are external to the electrostatic discharge protection device; and a conductive material electrically isolated from the first conductivity type well on the first conductivity type well adjacent to an interface between the first and second conductivity type wells to form the gate electrode.

15. The electrostatic discharge protection device of claim 14, wherein the second electrode is connected to a pad for protecting an electrostatic discharge and the first electrode is connected to a pad for leaking the electrostatic discharge.

* * * * *